US012532727B2

(12) United States Patent
Min et al.

(10) Patent No.: US 12,532,727 B2
(45) Date of Patent: Jan. 20, 2026

(54) SEMICONDUCTOR DEVICE, SEMICONDUCTOR MEMORY DEVICE INCLUDING THE SAME, ELECTRONIC SYSTEM INCLUDING THE SAME, AND METHOD FOR FABRICATING THE SAME

(71) Applicant: Samsung Electronics Co., Ltd., Suwon-si (KR)

(72) Inventors: Ju Seong Min, Seoul (KR); Jae-Bok Baek, Osan-si (KR); Jee Hoon Han, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 782 days.

(21) Appl. No.: 17/729,477

(22) Filed: Apr. 26, 2022

(65) Prior Publication Data

US 2023/0039511 A1 Feb. 9, 2023

(30) Foreign Application Priority Data

Aug. 6, 2021 (KR) .................. 10-2021-0103811

(51) Int. Cl.
*H01L 23/535* (2006.01)
*H01L 21/768* (2006.01)
(Continued)

(52) U.S. Cl.
CPC ...... *H01L 23/535* (2013.01); *H01L 21/76805* (2013.01); *H01L 21/76895* (2013.01);
(Continued)

(58) Field of Classification Search
CPC ......... H01L 21/76895; H01L 21/76805; H01L 23/535; H10B 41/41; H10B 41/27; H10B 43/40; H10B 43/27
See application file for complete search history.

(56) References Cited

U.S. PATENT DOCUMENTS 8,076,234 B1 12/2011 Park et al.
8,669,176 B1 3/2014 Tanwar
(Continued)

OTHER PUBLICATIONS

Korean Office Action dated Sep. 23, 2025 for corresponding Korean Patent Application No. 10-2021-0103811 and its English-language translation.
(Continued)

*Primary Examiner* — Brigitte A Paterson
(74) *Attorney, Agent, or Firm* — HARNESS, DICKEY & PIERCE, P.L.C.

(57) ABSTRACT

A semiconductor device includes a lower insulating film that includes a first and second trenches on a substrate, a first wiring in the first trench, a second wiring in the second trench, a capping insulating film including an insulating recess portion and an insulating liner portion, an upper insulating film on the capping insulating film, and an upper contact that penetrates the capping insulating film and connects to the first wiring, The insulating recess portion is in the second trench and the insulating liner portion extends along an upper surface of the lower insulating film. The upper contact includes a contact recess portion in the first trench, an extended portion connected to the contact recess portion, and a plug portion connected to the extended portion inside the upper insulating film. A width of the extended portion is greater than a width of the plug portion.

20 Claims, 33 Drawing Sheets

(51) Int. Cl.
*H10B 41/27* (2023.01)
*H10B 41/41* (2023.01)
*H10B 43/27* (2023.01)
*H10B 43/40* (2023.01)

(52) U.S. Cl.
CPC ............ *H10B 41/27* (2023.02); *H10B 41/41* (2023.02); *H10B 43/27* (2023.02); *H10B 43/40* (2023.02)

(56) References Cited

U.S. PATENT DOCUMENTS

| | | |
|---|---|---|
| 9,391,019 B2 | 7/2016 | Kobrinsky et al. |
| 10,840,189 B2 | 11/2020 | Tsai et al. |
| 10,937,689 B2 * | 3/2021 | Chandhok ......... H01L 21/76802 |
| 2018/0342455 A1 * | 11/2018 | Nosho ................... H10B 41/27 |
| 2020/0006131 A1 * | 1/2020 | Shimabukuro ... H01L 21/76814 |
| 2020/0006371 A1 * | 1/2020 | Huo ...................... H10B 43/40 |
| 2021/0013145 A1 | 1/2021 | Gstrein et al. |

OTHER PUBLICATIONS

Briggs, Benjamin D. et al. "Fully aligned via integration for extendibility of interconnects to beyond the 7 nm node." 2017 IEEE International Electron Devices Meeting (IEDM) (2017): 14.2.1-14.2.4.

* cited by examiner

SEMICONDUCTOR DEVICE, SEMICONDUCTOR MEMORY DEVICE INCLUDING THE SAME, ELECTRONIC SYSTEM INCLUDING THE SAME, AND METHOD FOR FABRICATING THE SAME

This application claims priority to Korean Patent Application No. 10-2021-0103811, filed on Aug. 6, 2021, and all the benefits accruing therefrom under 35 U.S.C. § 119, the disclosure of which is incorporated herein by reference in its entirety.

BACKGROUND

1. Technical Field

Inventive concepts relate to a semiconductor device, a semiconductor memory device including the same, an electronic system including the same, and/or a method for fabricating the same. More specifically, present inventive concepts relate to a semiconductor device having a wiring pattern having a fine line width, a semiconductor memory device including the same, an electronic system including the same, and/or a method for fabricating the same.

2. Description of the Related Art

There is a need to increase a degree of integration of a semiconductor device in order to satisfy excellent performance and low price required by consumers. In the case of the semiconductor devices, since the degree of integration may be an important factor in determining the price of a product, an increased degree of integration may be required.

On the other hand, in the case of a two-dimensional or planar semiconductor memory device, the degree of integration is mainly determined by an area occupied by a unit memory cell, and is therefore greatly affected by the level of the fine pattern forming technique. However, since the miniaturization of the pattern may require an ultra-expensive device, the degree of integration of the two-dimensional semiconductor device is increasing, but is still limited. Accordingly, three-dimensional semiconductor devices including memory cells arranged three-dimensionally have been proposed.

SUMMARY

Aspects of inventive concepts provide a semiconductor device having improved product reliability and yield.

Aspects of inventive concepts also provide a semiconductor memory device including the semiconductor device having improved product reliability and yield.

Aspects of inventive concepts also provide an electronic system including the semiconductor device having improved product reliability and yield.

Aspects of inventive concepts also provide a method for fabricating the semiconductor device having improved product reliability and yield.

However, aspects of inventive concepts are not restricted to the one set forth herein. Other aspects of inventive concepts will become more apparent to one of ordinary skill in the art to which inventive concepts pertain by referencing the detailed description of example embodiments inventive concepts given below.

According to an embodiment of inventive concepts, a semiconductor device may include a lower insulating film including a first trench and a second trench adjacent to each other on a substrate, a first wiring that fills a part of the first trench, a second wiring that fills a part of the second trench, a capping insulating film including an insulating recess portion and an insulating liner, an upper insulating film that covers an upper surface of the capping insulating film, and an upper contact that penetrates the capping insulating film and is connected to the first wiring. The insulating recess portion may fill an other part of the second trench on the second wiring. The insulating liner portion may extend along an upper surface of the lower insulating film. The upper contact may include a contact recess portion filling an other part of the first trench, an extended portion connected to the contact recess portion inside the insulating liner portion, and a plug portion connected to the extended portion inside the upper insulating film. A width of the extended portion may be greater than a width of the plug portion.

According to an embodiment of inventive concepts, a semiconductor memory device may include a peripheral circuit element on a substrate, a lower insulating film that covers the peripheral circuit element on the substrate, a wiring pattern connected to the peripheral circuit element inside the lower insulating film, a capping insulating film that covers an upper surface of the lower insulating film and an upper surface of the wiring pattern, a mold structure including a plurality of gate electrodes that are spaced apart from each other and sequentially stacked on the capping insulating film, a channel structure that extends in a vertical direction that intersects an upper surface of the substrate and intersects the plurality of gate electrode, an upper insulating film that covers the mold structure on the capping insulating film, and an upper contact that penetrates the capping insulating film and is connected to at least a part of the wiring pattern. The upper contact may include a contact recess portion that contacts at least the part of the wiring pattern inside the lower insulating film, an extended portion connected to the contact recess portion inside the capping insulating film, and a plug portion connected to the extended portion inside the upper insulating film. A width of the extended portion may be greater than a width of the plug portion.

According to an embodiment of inventive concepts, an electronic system may include a main board, a semiconductor memory device on the main board, and a controller electrically connected to the semiconductor memory device on the main board. The semiconductor memory device may include an I/O pad, a peripheral circuit element connected to the I/O pad on a substrate, a lower insulating film that covers the peripheral circuit element on the substrate, a wiring pattern connected to the peripheral circuit element inside the lower insulating film, a capping insulating film that covers an upper surface of the lower insulating film and an upper surface of the wiring pattern, an upper insulating film that covers an upper surface of the capping insulating film, and an upper contact that penetrates the capping insulating film and is connected to at least a part of the wiring pattern. The upper contact may include a contact recess portion contacting at least a part of the wiring pattern inside the lower insulating film, an extended portion connected to the contact recess portion inside the capping insulating film, and a plug portion connected to the extended portion inside the upper insulating film. A width of the extended portion may be greater than a width of the plug portion.

According to an embodiment of inventive concepts, a method for fabricating a semiconductor device may include forming a lower insulating film on a substrate, the lower insulating film including a wiring trench; forming a wiring pattern that fills the wiring trench inside the lower insulating film; removing an upper part of the wiring pattern; forming a capping insulating film that covers the wiring pattern and the lower insulating film; forming an upper insulating film that covers the capping insulating film; forming a contact hole that penetrates the capping insulating film and exposes at least a part of the wiring pattern; removing a part of the capping insulating film exposed by the contact hole; and forming an upper contact that fills the contact hole.

BRIEF DESCRIPTION OF THE DRAWINGS

The above and other aspects and features of embodiments of inventive concepts will become more apparent by describing in detail example embodiments of inventive concepts with reference to the attached drawings, in which.

DETAILED DESCRIPTION OF EMBODIMENTS

Hereinafter, a semiconductor device according to example embodiments will be described referring to FIGS. 1 to 4E.

Figure 1:
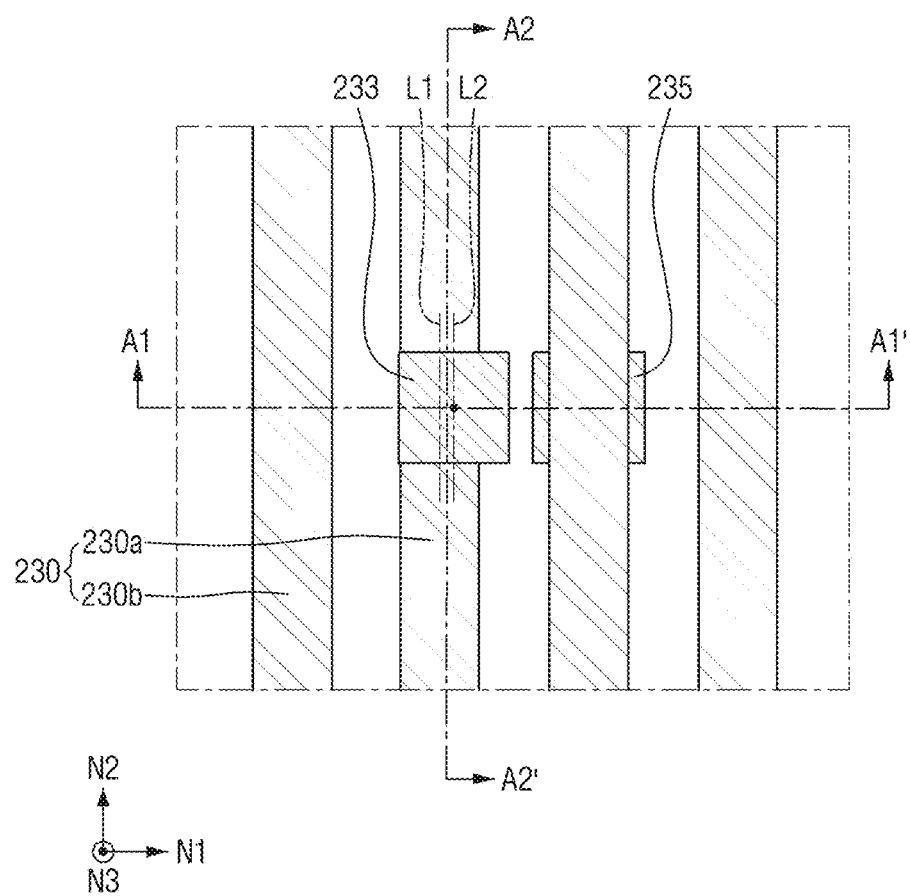
FIG. 1 is an example layout diagram for explaining a semiconductor device according to some embodiments.

FIG. 1 is an example layout diagram for explaining a semiconductor device according to some embodiments.

Figure 2A:
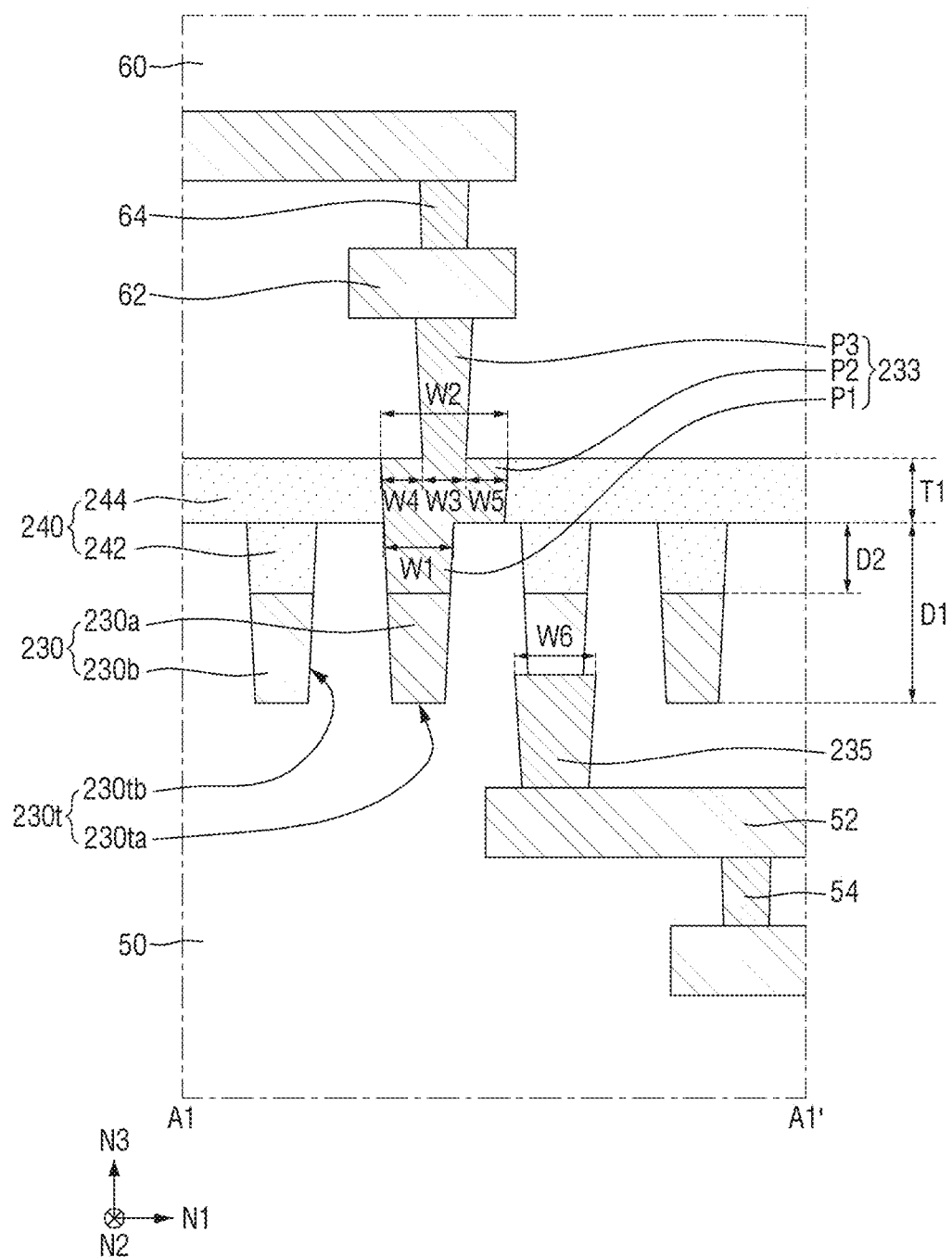
FIG. 2A is a cross-sectional view taken along line A1-A1' of FIG. 1.
Figure 2B:
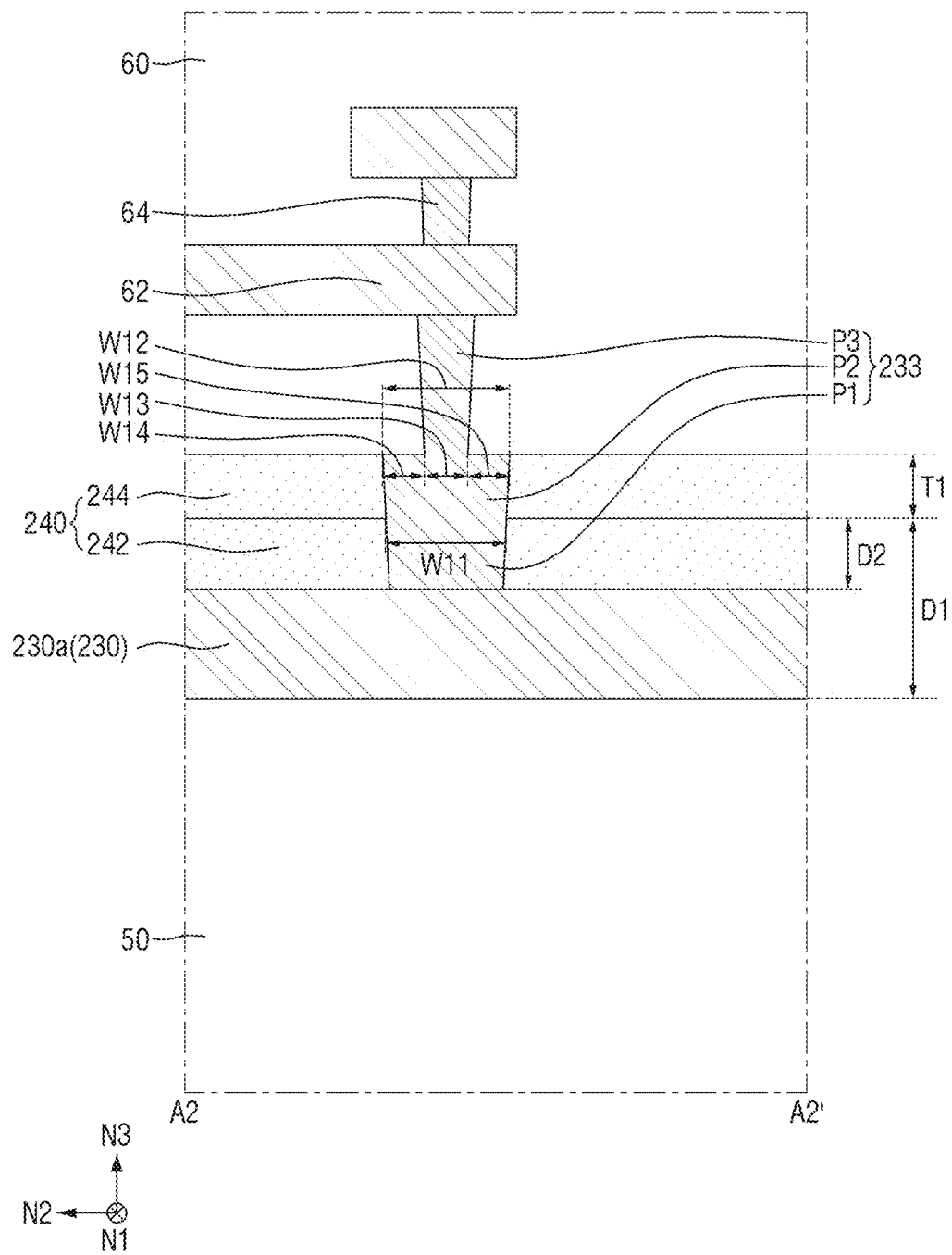
FIG. 2B is a cross-sectional view taken along a line A2-A2' of FIG. 1.
Figure 3:
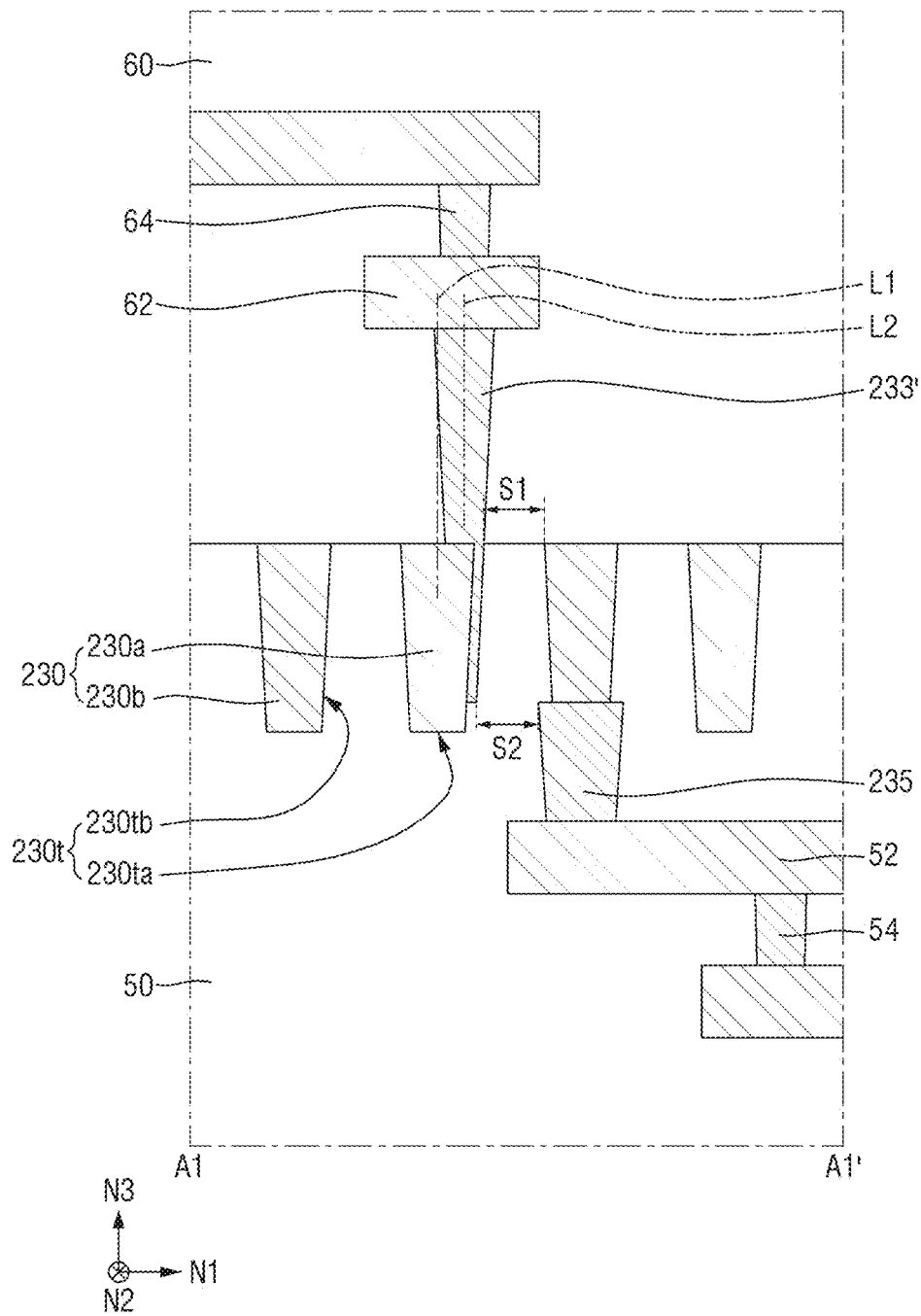
FIG. 3 is a cross-sectional view for explaining the effect of the semiconductor device of FIGS. 1 to 2B.

FIG. 2A is a cross-sectional view taken along line A1-A1' of FIG. 1. FIG. 2B is a cross-sectional view taken along a line A2-A2' of FIG. 1. FIG. 3 is a cross-sectional view for explaining the effect of the semiconductor device of FIGS. 1 to 2B.

Referring to FIGS. 1 to 2B, the semiconductor device according to some embodiments includes a lower insulating film 50, lower wiring structures 52 and 54, a wiring pattern 230, a capping insulating film 240, an upper insulating film 60, upper wiring structures 62 and 64, a lower contact 235, and an upper contact 233.

The lower insulating film 50 may be formed on a substrate (not shown). The substrate may include, for example, a semiconductor substrate such as a silicon substrate, a germanium substrate or a silicon-germanium substrate. Alternatively, the substrate may include a silicon-on-insulator (SOI) substrate, a germanium-on-insulator (GOI) substrate, and the like. The lower insulating film 50 may include at least one of an insulating material, for example, a silicon oxide, a silicon nitride, a silicon oxynitride, and a low dielectric constant (low-k) material having a dielectric constant lower than that of silicon oxide. As an example, the lower insulating film 50 may include, but is not limited to, a silicon oxide.

The lower wiring structures 52 and 54 may be formed inside the lower insulating film 50. The lower wiring structures 52 and 54 may include, for example, lower wirings 52 formed as multiple layers, and a lower connecting via 54 that interconnects the lower wirings 52. The lower wirings 52 and the lower connecting via 54 may each include conductive material, for example, metals such as tungsten (W), titanium (Ti), tantalum (Ta), copper (Cu) and aluminum (Al) and/or metal nitrides such as titanium nitride, tantalum nitride and tungsten nitride. As an example, the lower wirings 52 and the lower connecting vias 54 may each include, but are not limited to, tungsten (W).

The wiring pattern 230 may be formed inside the lower insulating film 50. An upper surface of the wiring pattern 230 may be exposed from an upper surface of the lower insulating film 50. For example, the wiring pattern 230 may be wiring placed at the uppermost part among the wirings formed inside the lower insulating film 50. The upper surface of the wiring pattern 230 may be formed to be lower than the upper surface of the lower insulating film 50. For example, the lower insulating film 50 may include a wiring trench 230t. The wiring pattern 230 may be formed to fill only a part (that is, the lower part) of the wiring trench 230t. In some embodiments, the width of the wiring trench 230t may decrease as it goes away from the upper surface of the lower insulating film 50. This may be due to the characteristics of an etching process for forming the wiring trench 230t.

A depth D1 of the wiring trench 230t may be, for example, from about 50 nm to about 200 nm. As an example, the depth D1 of the wiring trench 230t may be from about 70 nm to about 150 nm. A depth D2 of the upper surface of the wiring pattern 230 may be about 5 nm to about 50 nm on the basis of the upper surface of the lower insulating film 50. As an example, the depth D2 of the upper surface of the wiring pattern 230 may be about 10 nm to about 30 nm.

The wiring pattern 230 may include a conductive material, for example, metals such as tungsten (W), titanium (Ti), tantalum (Ta), copper (Cu) and aluminum (Al) and/or metal nitrides such as titanium nitride, tantalum nitride and tungsten nitride. As an example, the wiring pattern 230 may include, but is not limited to, tungsten (W).

The wiring pattern 230 may include a first wiring 230*a* and a second wiring 230*b* that are spaced apart from each other. The first wiring 230*a* and the second wiring 230*b* may be spaced apart from each other, for example, in a first direction N1 parallel to the upper surface of the substrate. The first wiring 230*a* may fill a part of a first trench 230*ta* inside the lower insulating film 50, and the second wiring 230*b* may fill a part of a second trench 230*tb* inside the lower insulating film 50. Although the example only shows that the first wiring 230*a* and the second wiring 230*b* are parallel to the upper surface of the substrate and extend side by side in a second direction N2 intersecting the first direction N1, this is merely an example, and it goes without saying that the direction in which the first wiring 230*a* and/or the second wiring 230*b* extend may be various. The first wiring 230*a* may be connected to an upper contact 233 to be described below, and the second wiring 230*b* may not be connected to the upper contact 233 to be described below.

In some embodiments, the wiring pattern 230 may be a wiring pattern having a fine line width. As an example, the line width (critical dimension) of the wiring pattern 230 may be about 30 nm or less. As an example, a width of each of the first wiring 230*a* and the second wiring 230*b* and/or a distance between the first wiring 230*a* and the second wiring 230*b* may be about 5 nm to about 30 nm, respectively.

The capping insulating film 240 may be formed on the lower insulating film 50. The capping insulating film 240 may cover at least a part of the upper surface of the lower insulating film 50. The capping insulating film 240 may include an insulating recess portion 242 and an insulating liner portion 244. The insulating recess portion 242 may be formed inside the lower insulating film 50 on the wiring pattern 230. The insulating recess portion 242 may fill another part (that is, the upper part) of the wiring trench 230*t* that remains after the wiring pattern 230 is filled. The insulating liner portion 244 may be formed on the lower insulating film 50 and the insulating recess portion 242. The insulating liner portion 244 may extend along the upper surface of the lower insulating film 50 and the upper surface of the insulating recess portion 242. Accordingly, the capping insulating film 240 may cover the lower insulating film 50 and the wiring pattern 230.

A thickness T1 of the insulating liner portion 244 may be, for example, from about 1 nm to about 50 nm. As an example, the thickness T1 of the insulating liner portion 244 may be from about 5 nm to about 15 nm.

In some embodiments, the upper surface of the insulating recess portion 242 may be coplanar as the upper surface of the lower insulating film 50. Although FIGS. 2A and 2B only show that a boundary is formed between the insulating recess portion 242 and the insulating liner portion 244, this is merely an example. In another example, it goes without saying that the insulating recess portion 242 and the insulating liner portion 244 are formed at the same level, and a boundary may not be formed between them. As used herein, the term "same level" means that both portions are formed by the same fabricating process.

The capping insulating film 240 may include an insulating material, for example, at least one of silicon oxide, silicon nitride and silicon oxynitride. In some embodiments, the capping insulating film 240 may include an insulating material having an etching selectivity with respect to the lower insulating film 50. As an example, the lower insulating film 50 may include silicon oxide, and the capping insulating film 240 may include silicon nitride.

The upper insulating film 60 may be formed on the capping insulating film 240. The upper insulating film 60 may cover at least a part of the upper surface of the capping insulating film 240. The upper insulating film 60 may include an insulating material, for example, at least one of silicon oxide, silicon nitride, silicon oxynitride, and a low dielectric constant (low-k) material having a dielectric constant lower than that of the silicon oxide. As an example, the upper insulating film 60 may include, but is not limited to, a silicon oxide. In some embodiments, the upper insulating film 60 may include an insulating material having an etching selectivity with respect to the capping insulating film 240. As an example, the capping insulating film 240 may include silicon nitride, and the upper insulating film 60 may include silicon oxide.

The upper wiring structures 62 and 64 may be formed inside the upper insulating film 60. The upper wiring structures 62 and 64 may include, for example, upper wirings 62 formed as multiple layers, and an upper connecting via 64 that interconnects the upper wirings 62. The upper wirings 62 and the upper connecting via 64 may each include a conductive material, for example, metals such as tungsten (W), titanium (Ti), tantalum (Ta), copper (Cu) and aluminum (Al) and/or metal nitrides such as titanium nitride, tantalum nitride and tungsten nitride. In an example, the upper wirings 62 and the upper connecting via 64 may each include, but are not limited to, tungsten (W).

The lower contact 235 may connect the wiring pattern 230 and the lower wiring structures 52 and 54. For example, the lower contact 235 may come into contact with the upper surface of the lower wiring 52 and the lower surface of the wiring pattern 230. The wiring pattern 230 may be electrically connected to the lower wiring 52 through the lower contact 235. The lower contact 235 may include a conductive material, for example, metals such as tungsten (W), titanium (Ti), tantalum (Ta), copper (Cu) and aluminum (Al) and/or metal nitrides such as titanium nitride, tantalum nitride and tungsten nitride. As an example, the lower contact 235 may include, but is not limited to, tungsten (W).

In some embodiments, the upper surface of the lower contact 235 may be formed to be higher than the lowermost side of the wiring pattern 230. For example, as shown in FIG. 2A, the upper surface of the lower contact 235 may be formed to be higher than the lower surface of the first wiring 230*a*. However, this is merely an example, and in some other embodiments, the upper surface of the lower contact 235 may be coplanar as a lowermost side of the wiring pattern 230.

In some embodiments, the lower contact 235 may be connected to a second wiring 230*b* adjacent to the first wiring 230*a*. For example, the upper surface of the lower contact 235 may come into contact with the lower surface of the second wiring 230*b* adjacent to the first wiring 230*a*.

In some embodiments, a width W6 of the lower contact 235 may be greater than a width of the wiring pattern 230. For example, the width W6 of the upper surface of the lower contact 235 may be greater than the width of the lower surface of the second wiring 230*b* connected to the lower contact 235. Here, the width of the second wiring 230*b* means a width in a direction (e.g., the first direction N1) intersecting the direction in which the second wiring 230*b* extends (e.g., the second direction N2). As an example, the width of the second wiring 230*b* may be from about 20 nm to about 30 nm, and the width W6 of the lower contact 235 may be from about 40 nm to about 60 nm.

The upper contact 233 may connect the wiring pattern 230 and the upper wiring structures 62 and 64. For example, the upper contact 233 may come into contact with the upper surface of the wiring pattern 230 and the lower surface of the lower wiring 52. The wiring pattern 230 may be electrically connected to the upper wiring 62 through the upper contact 233. The upper contact 233 may include a conductive material, for example, metals such as tungsten (W), titanium (Ti), tantalum (Ta), copper (Cu) and aluminum (Al) and/or metal nitrides such as titanium nitride, tantalum nitride and tungsten nitride. In an example, the upper contact 233 may include, but is not limited to, tungsten (W).

The upper contact 233 penetrates the capping insulating film 240 and may be connected to a part of the wiring pattern 230. For example, the upper contact 233 may be connected to the first wiring 230*a* and may not be connected to the second wiring 230*b*. The upper contact 233 may include a contact recess portion P1, an extended portion P2 and a plug portion P3. The contact recess portion P1 and the extended portion P2 penetrate the capping insulating film 240 and may be connected to the first wiring 230*a*. The contact recess portion P1 may be formed inside the insulating recess portion 242, and the extended portion P2 may be formed inside the insulating liner portion 244. The plug portion P3 is formed inside the upper insulating film 60, and may connect the extended portion P2 and the upper wiring structures 62 and 64.

More specifically, the contact recess portion P1 may be a part of the upper contact 233 that comes into contact with the upper surface of the wiring pattern 230. The contact recess portion P1 may be formed inside the lower insulating film 50 on the wiring pattern 230. For example, the contact recess portion P1 may fill another part (that is, the upper part) of the first trench 230*ta* that remains after the first wiring 230*a* is filled. The contact recess portion P1 may penetrate the insulating recess portion 242 to connect the wiring pattern 230 and the extended portion P2. In some embodiments, the lower surface of the contact recess portion P1 may be coplanar as the lower surface of the insulating recess portion 242. The contact recess portion P1 may be formed by filling a space from which a part of the insulating recess portion 242 is removed.

The extended portion P2 may be another part of the upper contact 233 that connects the contact recess portion P1 and the plug portion P3. The extended portion P2 may be formed on the upper surface of the lower insulating film 50. The extended portion P2 may penetrate the insulating liner portion 244 to connect the contact recess portion P1 and the plug portion P3. In some embodiments, the lower surface of the extended portion P2 may be coplanar as the lower surface of the insulating liner portion 244, and the upper surface of the extended portion P2 may be coplanar as the upper surface of the insulating liner portion 244. The extended portion P2 may be formed by filling the space from which a part of the insulating liner portion 244 is removed. In some embodiments, the width (e.g., W2) of the extended portion P2 may decrease toward the capping insulating film 240. This may be due to the characteristics of the etching process for forming the extended portion P2.

The plug portion P3 may be still another part of the upper contact 233 that connects the extended portion P2 and the upper wiring structures 62 and 64. The plug portion P3 may be formed inside the upper insulating film 60. The plug portion P3 may extend in a vertical direction (hereinafter, a third direction N3) intersecting the first direction N1 and the second direction N2) to connect the extended portion P2 and the upper wiring 62. The plug portion P3 may be formed by filling the space from which a part of the upper insulating film 60 is removed. In some embodiments, the width of the plug portion P3 may decrease toward the capping insulating film 240. This may be due to the characteristics of the etching process for forming the plug portion P3.

In some embodiments, the plug portion P3 may be shifted in a direction away from the first wiring 230*a* to which the upper contact 233 is connected. For example, as shown in FIG. 1, a center L2 of the plug portion P3 may be shifted in a direction away from the center L1 of the first wiring 230*a* (e.g., a right direction).

The extended portion P2 may have a form extending from the side face of the plug portion P3. For example, as shown in FIGS. 2A and 2B, the widths W2 and W12 of the extended portion P2 may be greater than the widths W3 and W13 of the plug portion P3. Accordingly, the plug portion P3 may have a shape protruding from the upper surface of the extended portion P2. Lengths W4, W5, W14, and W15 of the extended portion P2 extending from the side face of the plug portion P3 may be typically about 1 nm to about 20 nm, respectively. As an example, the lengths W4, W5, W14, and W15 of the extended portion P2 extending from the side face of the plug portion P3 may be about 5 nm to about 15 nm, respectively.

In some embodiments, the side face of the contact recess portion P1 may be continuous with the side face of the extended portion P2 in the direction in which the first trench 230*ta* extends (e.g., the second direction N2). For example, as shown in FIG. 2B, the width W11 of the contact recess portion P1 and the width W12 of the extended portion P2 may be continuous at the boundary between the insulating recess portion 242 and the insulating liner portion 244. This may be due to the characteristics of the etching process for forming the extended portion P2. For example, in the etching process for forming the extended portion P2, the speed at which the insulating recess portion 242 is removed may be the same as the speed at which the insulating liner portion 244 is removed. In the present specification, the meaning of "the same" includes not only completely the same but also minute differences that may occur due to process margins and the like.

In some embodiments, the width W2 of the extended portion P2 may be greater than the width W1 of the contact recess portion P1, in the direction (e.g., the first direction N1) that intersects the direction in which the first trench 230*ta* extends (e.g., the second direction N2). For example, the width W2 of the extended portion P2 may be greater than the width of the first trench 230*ta*. In such a case, as shown in FIG. 2A, the contact recess portion P1 may have a shape that protrudes from the lower surface of the extended portion P2. Further, the extended portion P2 may have a form that extends from at least one side face of the contact recess portion P1. This may be due to the characteristics of the etching process for forming the extended portion P2. For example, in the etching process for forming the extended portion P2, the lower insulating film 50 may not be removed while the capping insulating film 240 is removed.

As a semiconductor device gradually becomes highly integrated, the line width of wiring patterns gradually decreases. However, the wiring pattern of a fine line width is vulnerable to misalignment of a contact or the like, thus causes a defect in the semiconductor device. For example, referring to FIG. 3, the center L2 of the upper contact 233 connected to the first wiring 230*a* may be shifted in a direction (e.g., the right direction) away from the center L1 of the first wiring 230*a* due to misalignment or the like. In this case, because a distance S1 from the second wiring 230*b* adjacent to the first wiring 230*a* is narrow, the shifted upper contact 233 may cause defects such as a bridge between the upper contact 233 and the second wiring 230*b*.

Further, the shifted upper contact 233 may further extend below the upper surface of the lower insulating film 50. For example, as the upper contact 233 is shifted, the etching process for forming the upper contact 233 inside the upper insulating film 60 may etch to the lower insulating film 50 beyond the upper insulating film 60. In such a case, because a distance S2 from the lower contact 235 connected to the second wiring 230b is narrow, the shifted upper contact 233 may cause defects such as a bridge between the upper contact 233 and the lower contact 235.

However, the semiconductor device according to some embodiments can effectively limit and/or prevent defects of the semiconductor device due to misalignment or the like, by being equipped with the upper contact 233 including the contact recess portion P1, the extended portion P2 and the plug portion P3, and the capping insulating film 240 including the insulating recess portion 242 and the insulating liner portion 244.

Specifically, as described above using FIGS. 1 to 2B, the extended portion P2 and the contact recess portion P1 of the upper contact 233 are formed inside the capping insulating film 240, and may secure a sufficient distance from the second wiring 230b and the lower contact 235. For example, even if the plug portion P3 is shifted due to misalignment or the like, the extended portion P2 may secure a sufficient distance from the second wiring 230b in the third direction N3 by the insulating liner portion 244 and the insulating recess portion 242. Further, even if the plug portion P3 is shifted due to misalignment or the like, because the contact recess portion P1 is formed to fill the upper part of the first trench 230ta, the contact recess portion P1 may secure a sufficient distance from the second wiring 230b and the lower contact 235 in the first direction N1. Accordingly, it is possible to provide a semiconductor device having improved product reliability and yield.

Further, the upper contact 233 may include an extended portion P2 having a form extending from the side face of the plug portion P3, and may be connected to the first wiring 230a through the contact recess portion P1 that fills a part of the first trench 230ta. Accordingly, even if the plug portion P3 is shifted due to misalignment or the like, the upper contact 233 may be stably connected to the first wiring 230a.

FIGS. 4A to 4E are various other cross-sectional views for explaining a semiconductor device according to some embodiments. For convenience of explanation, repeated parts of contents explained using FIGS. 1 to 3 will be briefly described or omitted.

Figure 4A:
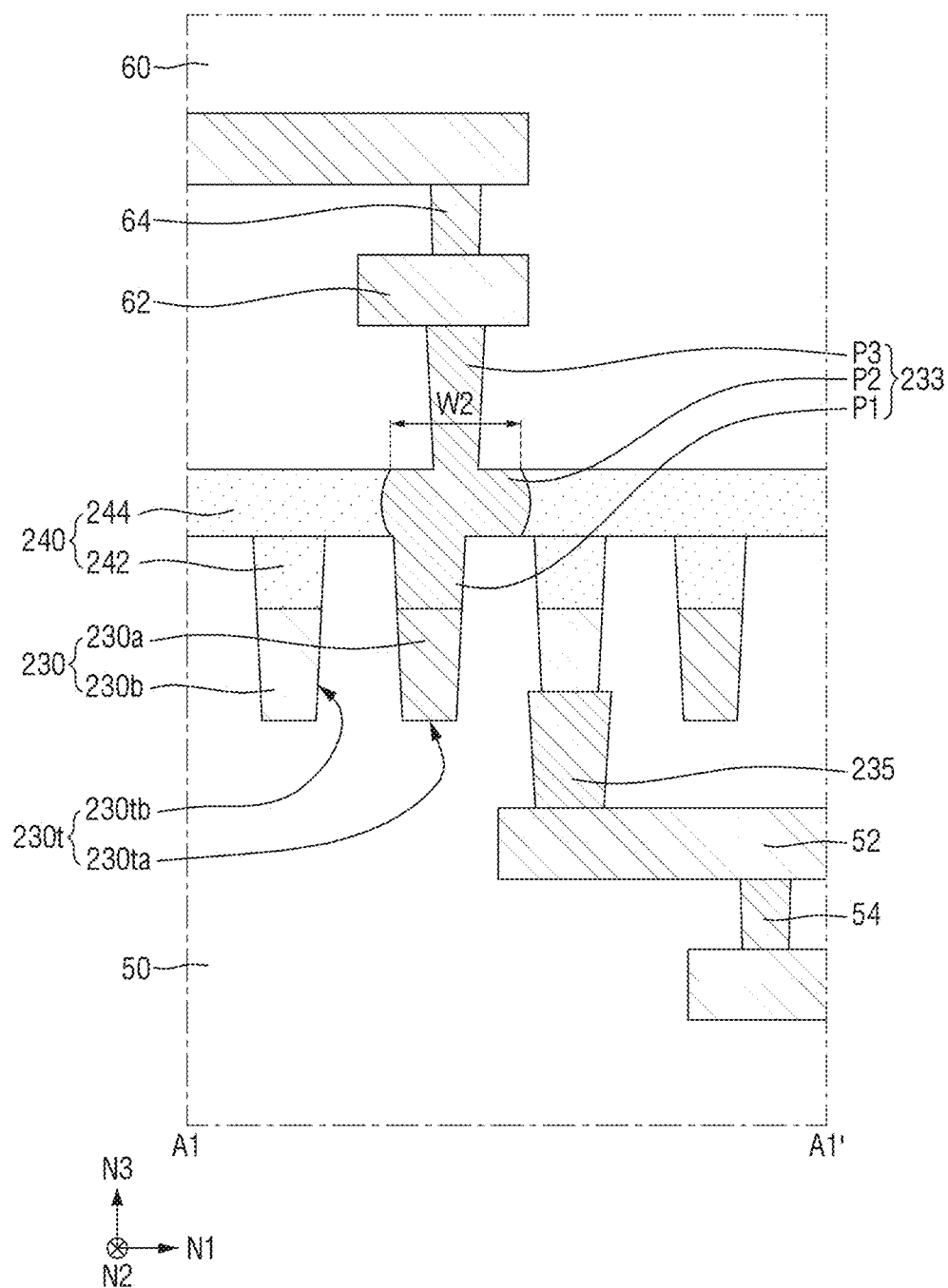
FIGS. 4A to 4E are various other cross-sectional views for explaining a semiconductor device according to some embodiments.

Referring to FIG. 4A, in a semiconductor device according to some embodiments, the width (e.g., W2) of the extended portion P2 may increase and then decrease toward the capping insulating film 240.

For example, the side face of the extended portion P2 may have a convex form. The side face of the insulating liner portion 244 adjacent to the extended portion P2 may have a concave form. This may be due to the characteristics of the etching process for forming the extended portion P2.

Figure 4B:
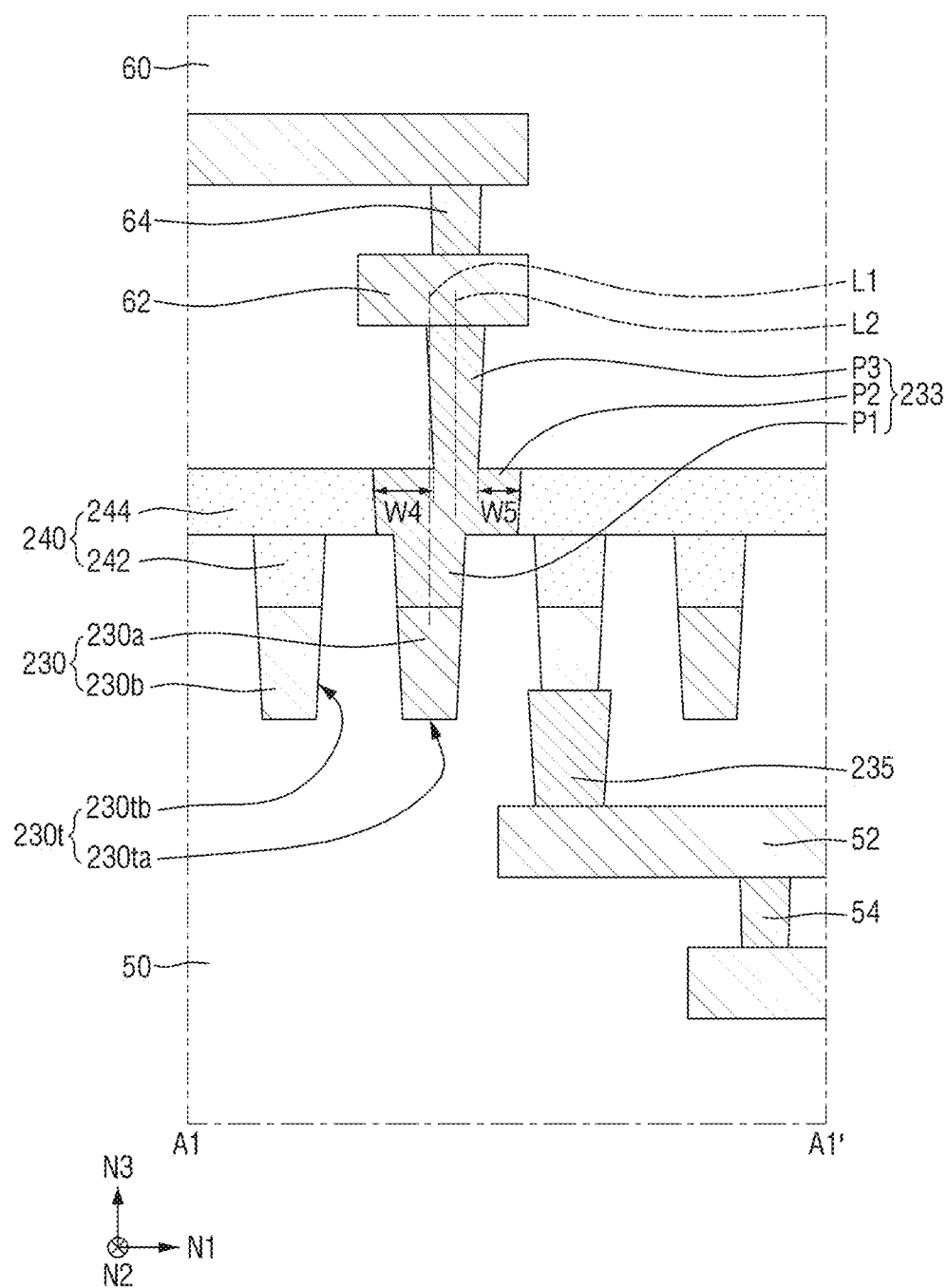

Referring to FIG. 4B, in the semiconductor device according to some embodiments, a length W4 at which one side of the extended portion P2 extends is different from a length W5 at which the other side of the extended portion P2 extends.

For example, the length W4 at which one side face of the extended portion P2 extends may be larger than the length W5 at which the other side face of the extended portion P2 extends. This may be due to the characteristics of the etching process for forming the extended portion P2. For example, in the etching process for forming the extended portion P2, the speed at which the capping insulating film 240 is removed from one side face of the plug portion P3 may differ from the speed at which the capping insulating film 240 is removed from the other side face of the plug portion P3.

Figure 4C:
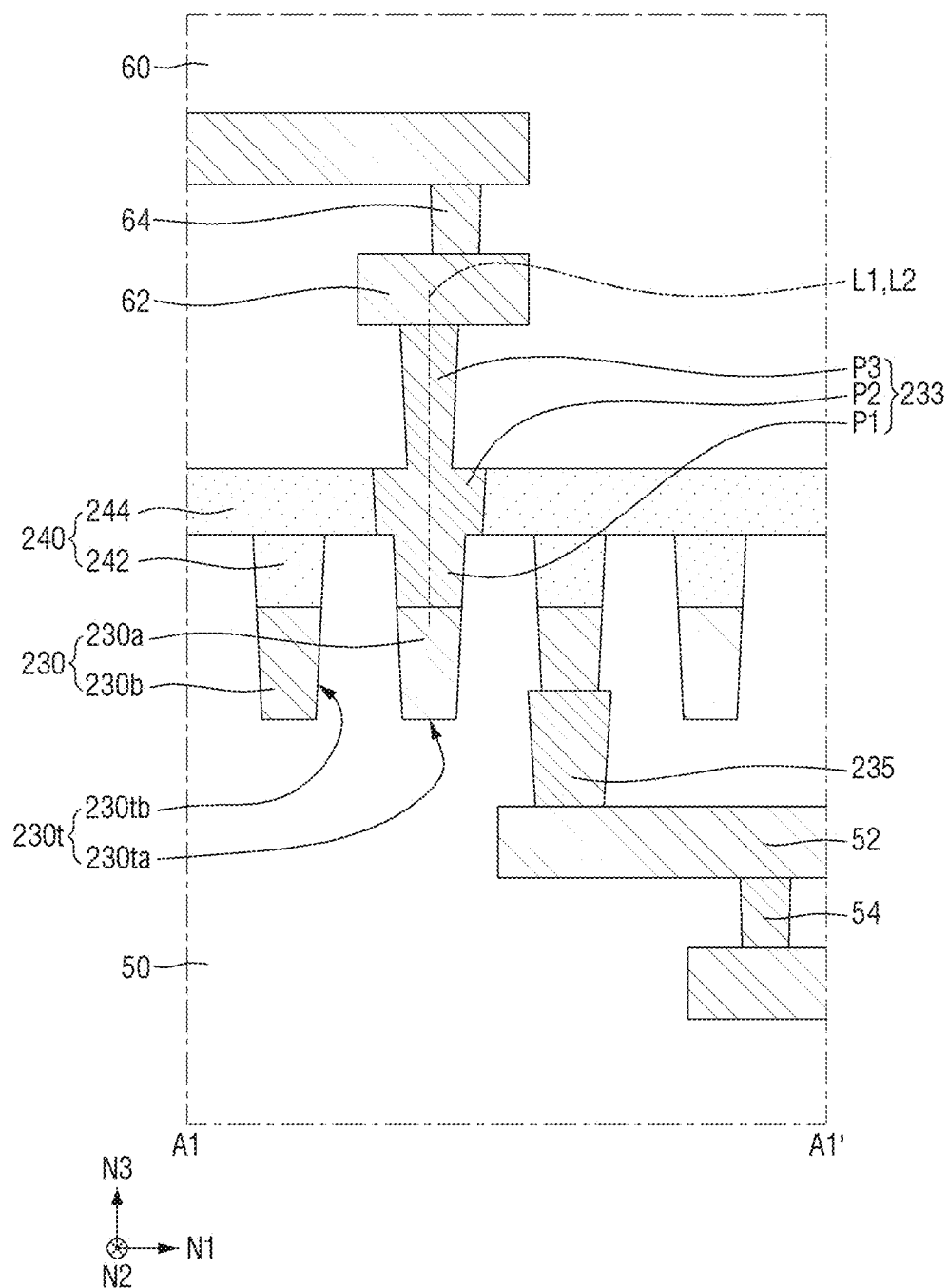

Referring to FIG. 4C, in the semiconductor device according to some embodiments, the plug portion P3 is not shifted from the first wiring 230a.

For example, the center L2 of the plug portion P3 may coincide with the center L1 of the first wiring 230a. In this case, the upper contact 233 may be formed symmetrically on the basis of the center L1 of the first wiring 230a.

Figure 4D:
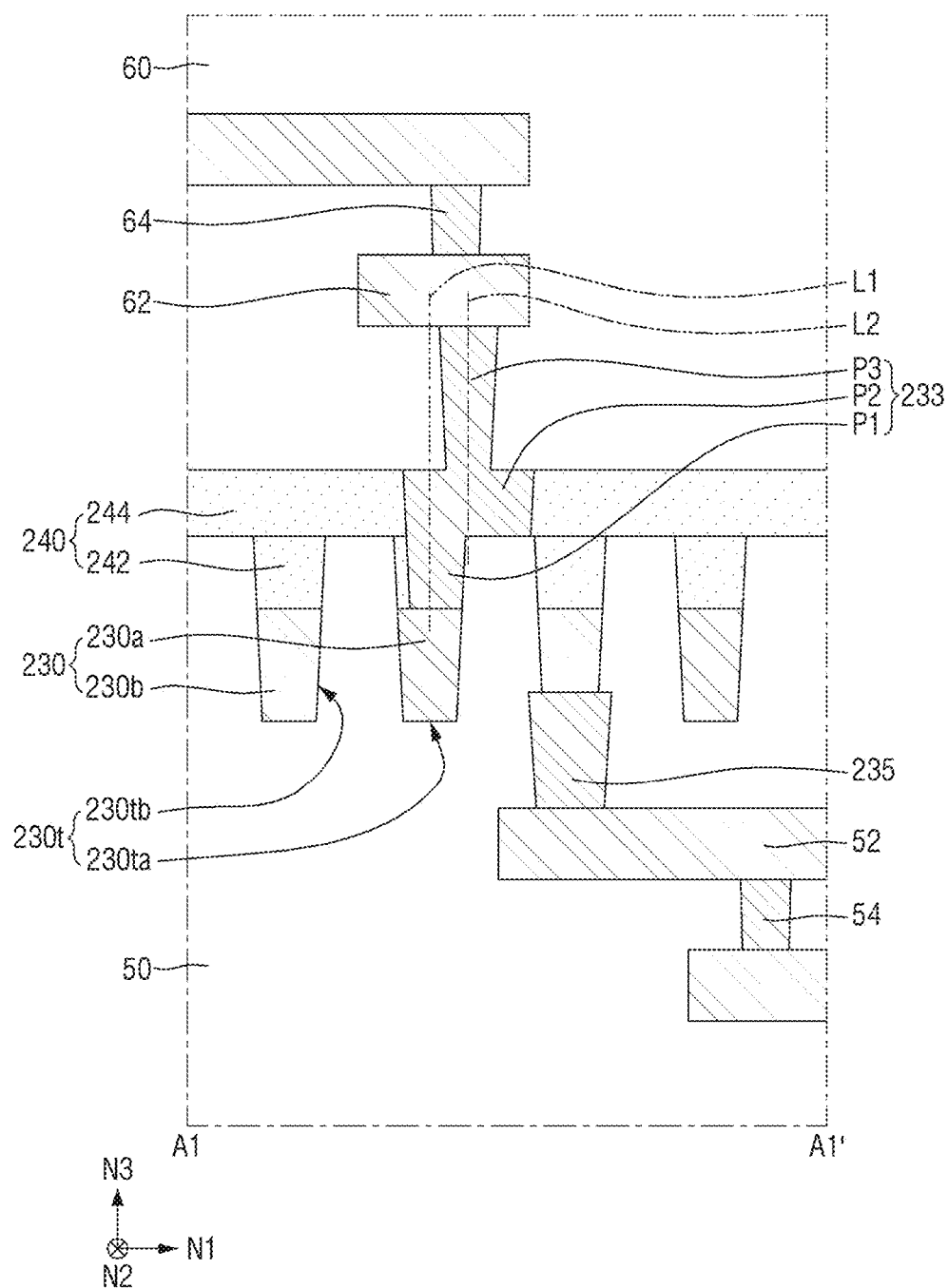

Referring to FIG. 4D, in the semiconductor device according to some embodiments, the insulating recess portion 242 is interposed between at least one side face of the contact recess portion P1 and one side face of the first trench 230ta.

For example, as compared with FIG. 4A, the center L2 of the plug portion P3 may be further shifted from the center L1 of the first wiring 230a. In this case, the etching process for forming the extended portion P2 may not expose at least one side face of the first trench 230ta. That is, the width of the contact recess portion P1 may be formed to be smaller than the width of the first trench 230ta in the direction (e.g., the first direction N1) intersecting the direction in which the first trench 230ta extends (e.g., the second direction N2). The insulating recess portion 242 may separate at least one side face of the contact recess portion P1 from one side face of the first trench 230ta.

In some embodiments, one side face of the contact recess portion P1 may be continuous with one side face of the extended portion P2 in the direction (e.g., the first direction N1) intersecting the direction in which the first trench 230ta extends (e.g., second direction N2). This may be due to the characteristics of the etching process for forming the extended portion P2. For example, in the etching process for forming the extended portion P2, the speed at which the insulating recess portion 242 is removed may be the same as the speed at which the insulating liner portion 244 is removed.

Figure 4E:
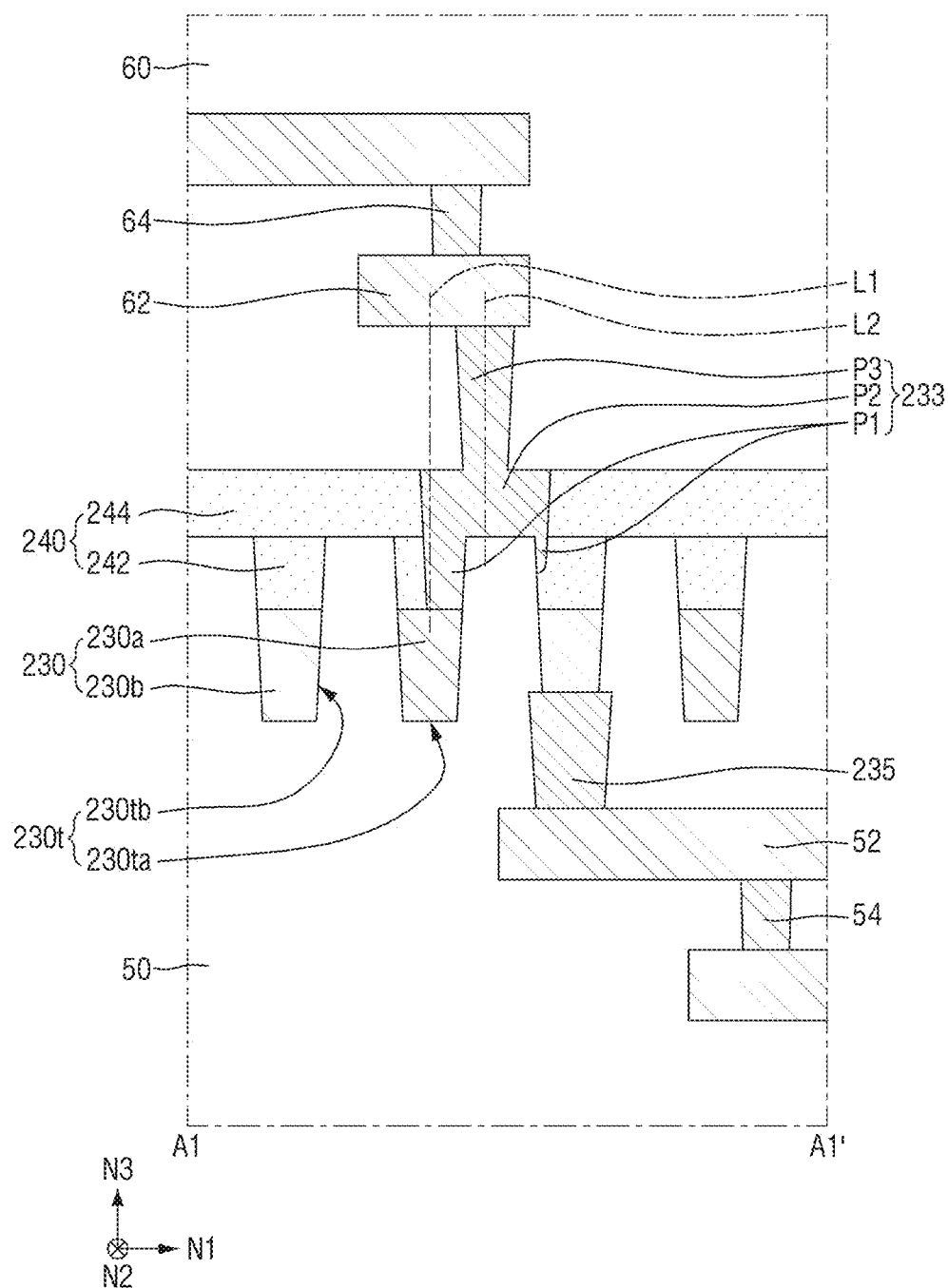

Referring to FIG. 4E, in the semiconductor device according to some embodiments, a part of the upper contact 233 overlaps a part of the second wiring 230b.

For example, as compared with FIG. 4D, the center L2 of the plug portion P3 may be further shifted from the center L1 of the first wiring 230a. In this case, the etching process for forming the extended portion P2 may expose at least one side face of the second trench 230tb. Accordingly, a part of the contact recess portion P1 may fill not only the upper part of the first trench 230ta but also the upper part of the second trench 230tb.

In some embodiments, the contact recess portion P1 formed inside the second trench 230tb may be spaced apart from the second wiring 230b. For example, the lowermost side of the contact recess portion P1 formed inside the second trench 230tb may be formed to be higher than the upper surface of the second wiring 230b.

Hereinafter, a semiconductor memory device including the semiconductor device according to example embodiments will be described referring to FIGS. 1 to 14. For convenience of explanation, repeated parts of contents explained using FIGS. 1 to 4E will be briefly described or omitted.

Although only a flash memory having three-dimensionally arranged memory cells will be described as an example of the semiconductor memory device, this is merely an example. As another example, it is a matter of course that the semiconductor memory device according to some embodiments may be another non-volatile memory such as a PRAM (Phase-change Random Access Memory), a MRAM (Magnetoresistive Random Access Memory), a FeRAM (Ferroelectric Random Access Memory) or a RRAM (Resistive Random Access Memory), or may be a volatile memory such as a DRAM (dynamic random access memory) or an SRAM (static random access memory).

Figure 5:
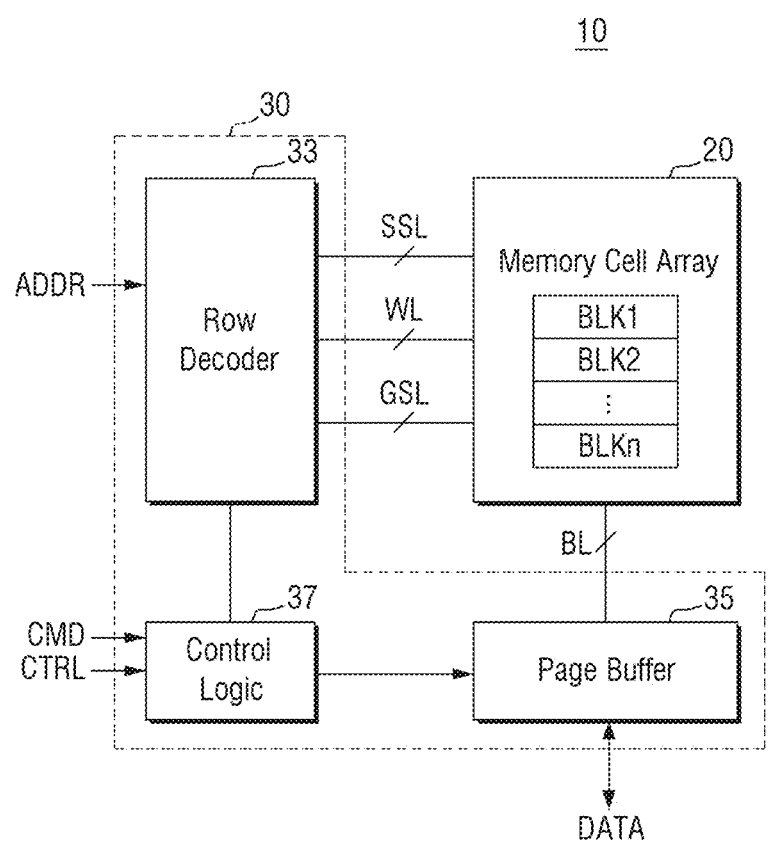
FIG. 5 is an example block diagram for explaining a semiconductor memory device according to some embodiments.

FIG. 5 is an example block diagram for explaining a semiconductor memory device according to some embodiments.

Referring to FIG. 5, a semiconductor memory device 10 according to some embodiments includes a memory cell array 20 and a peripheral circuit 30.

The memory cell array 20 may include a plurality of memory cell blocks BLK1 to BLKn. Each of the memory cell blocks BLK1 to BLKn may include a plurality of memory cells. The memory cell array 20 may be connected to the peripheral circuit 30 through a bit line BL, a word line WL, at least one string selection line SSL, and at least one ground selection line GSL. Specifically, the memory cell blocks BLK1 to BLKn may be connected to a row decoder 33 through the word line WL, the string selection line SSL, and the ground selection line GSL. Further, the memory cell blocks BLK1 to BLKn may be connected to a page buffer 35 through the bit line BL.

The peripheral circuit 30 may receive an address ADDR, a command CMD, and a control signal CTRL from the outside of the semiconductor memory device 10, and may transmit and receive data DATA to and from an outside device of the semiconductor memory device 10. The peripheral circuit 30 may include a control logic 37, a row decoder 33, and a page buffer 35. Although not shown, the peripheral circuit 30 may further include various sub-circuits, such as an input/output circuit, a voltage generation circuit that generates various voltages necessary for the operation of the semiconductor memory device 10, an error correction circuit for correcting errors of the data DATA that is read from the memory cell array 20.

The control logic 37 may be connected to the row decoder 33, the input/output circuit, and the voltage generation circuit. The control logic 37 may control the overall operations of the semiconductor memory device 10. The control logic 37 may generate various internal control signals used in the semiconductor memory device 10 in response to the control signal CTRL. For example, the control logic 37 may adjust the voltage levels provided to the word line WL and the bit line BL when performing a memory operation such as a program operation or an erase operation.

The row decoder 33 may select at least one of the plurality of memory cell blocks BLK1 to BLKn in response to the address ADDR, and may select at least one word line WL, at least one string selection line SSL, and at least one ground selection line GSL of the selected memory cell blocks BLK1 to BLKn. Further, the row decoder 33 may transmit a voltage for performing the memory operation to the word line WL of the selected memory cell blocks BLK1 to BLKn.

The page buffer 35 may be connected to the memory cell array 20 through the bit line BL. The page buffer 35 may operate as a write driver or a sense amplifier. Specifically, when performing the program operation, the page buffer 35 operates as a write driver, and may apply a voltage according to the data DATA to be stored in the memory cell array 20 to the bit line BL. On the other hand, when performing the read operation, the page buffer 35 operates as a sense amplifier and may sense the data DATA stored in the memory cell array 20.

Figure 6:
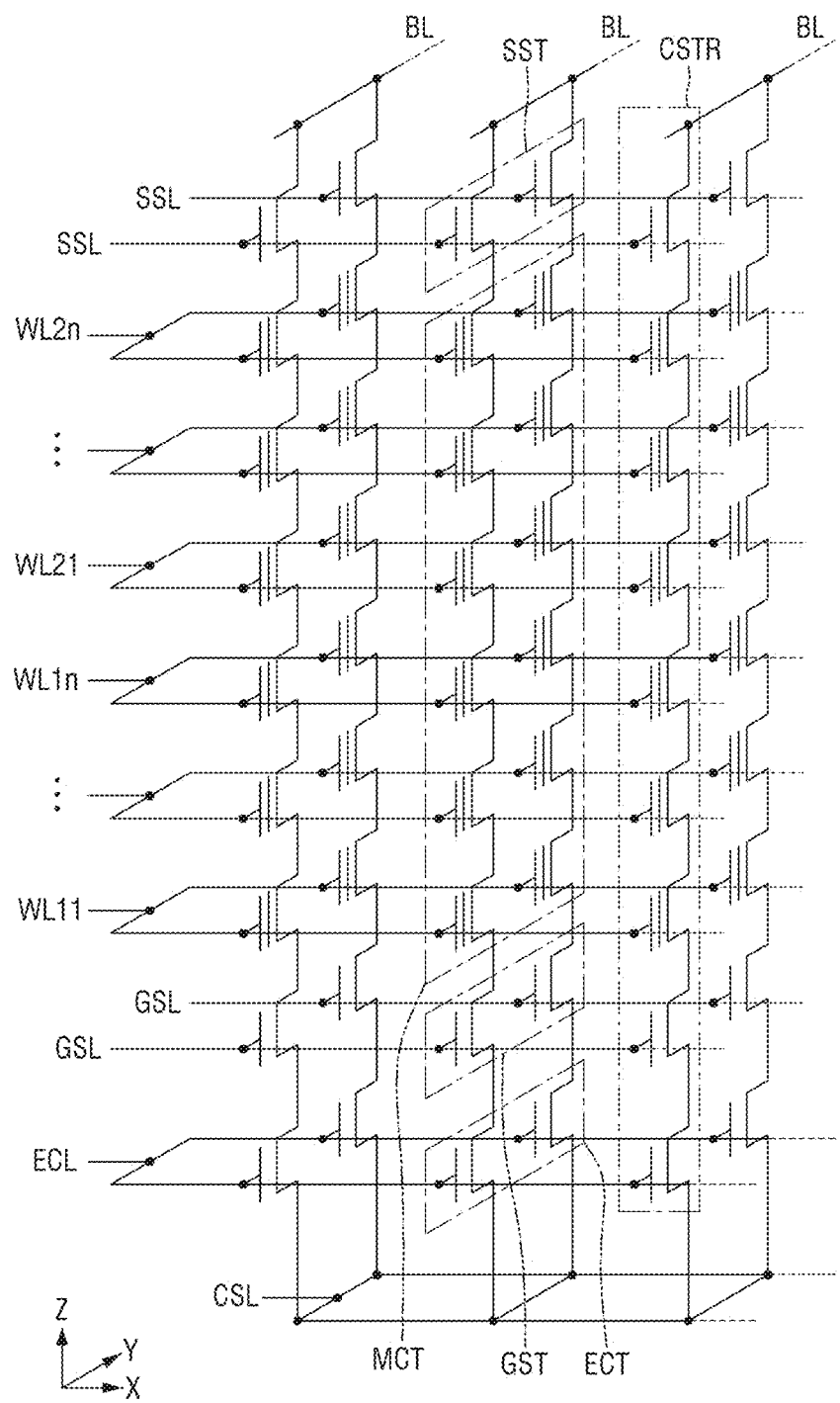
FIG. 6 is an example circuit diagram for explaining a semiconductor memory device according to some embodiments.

FIG. 6 is an example circuit diagram for explaining a semiconductor memory device according to some embodiments.

Referring to FIG. 6, the memory cell array (e.g., 20 of FIG. 5) of the semiconductor memory device according to some embodiments includes a common source line CSL, a plurality of bit lines BL, and a plurality of cell strings CSTR.

The common source line CSL may extend in a fourth direction X. In some embodiments, a plurality of common source lines CSL may be arranged two-dimensionally. For example, the plurality of common source lines CSL may be spaced apart from each other and extend in the fourth direction X, respectively. The same voltage may be electrically applied to the common source lines CSL, or different voltages may be applied and the common source lines CSL may be controlled separately.

The plurality of bit lines BL may be arranged two-dimensionally. For example, the bit lines BL are spaced apart from each other and may each extend in a fifth direction Y, which intersects the fourth direction X. A plurality of cell strings CSTR may be connected in parallel to each bit line BL. The cell strings CSTR may be commonly connected to the common source line CSL. That is, a plurality of cell strings CSTR may be placed between the bit lines BL and the common source line CSL.

Each cell string CSTR may include a ground selection transistor GST connected to the common source line CSL, a string selection transistor SST connected to the bit line BL, and a plurality of memory cell transistors MCT placed between the ground selection transistor GST and the string selection transistor SST. Each memory cell transistor MCT may include a data storage element. The ground selection transistor GST, the string selection transistor SST, and the memory cell transistors MCT may be connected in series.

The common source line CSL may be commonly connected to the sources of the ground selection transistors GST. Further, the ground selection line GSL, the plurality of word lines WL11 to WL1n and WL21 to WL2n, and the string selection line SSL may be placed between the common source line CSL and the bit line BL. The ground selection line GSL may be used as a gate electrode of the ground selection transistor GST, the word lines WL11 to WL1n and WL21 to WL2n may be used as gate electrodes of the memory cell transistor MCT, and the string selection line SSL may be used as a gate electrode of the string selection transistor SST.

In some embodiments, an erasure control transistor ECT may be placed between the common source line CSL and the ground selection transistor GST. The common source line CSL may be commonly connected to the sources of the erasure control transistors ECT. Further, an erasure control line ECL may be placed between the common source line CSL and the ground selection line GSL. The erasure control line ECL may be used as a gate electrode of the erasure control transistor ECT. The erasure control transistors ECT may generate a gate induced drain leakage (GIDL) to perform an erasure operation of the memory cell array.

Figure 7:
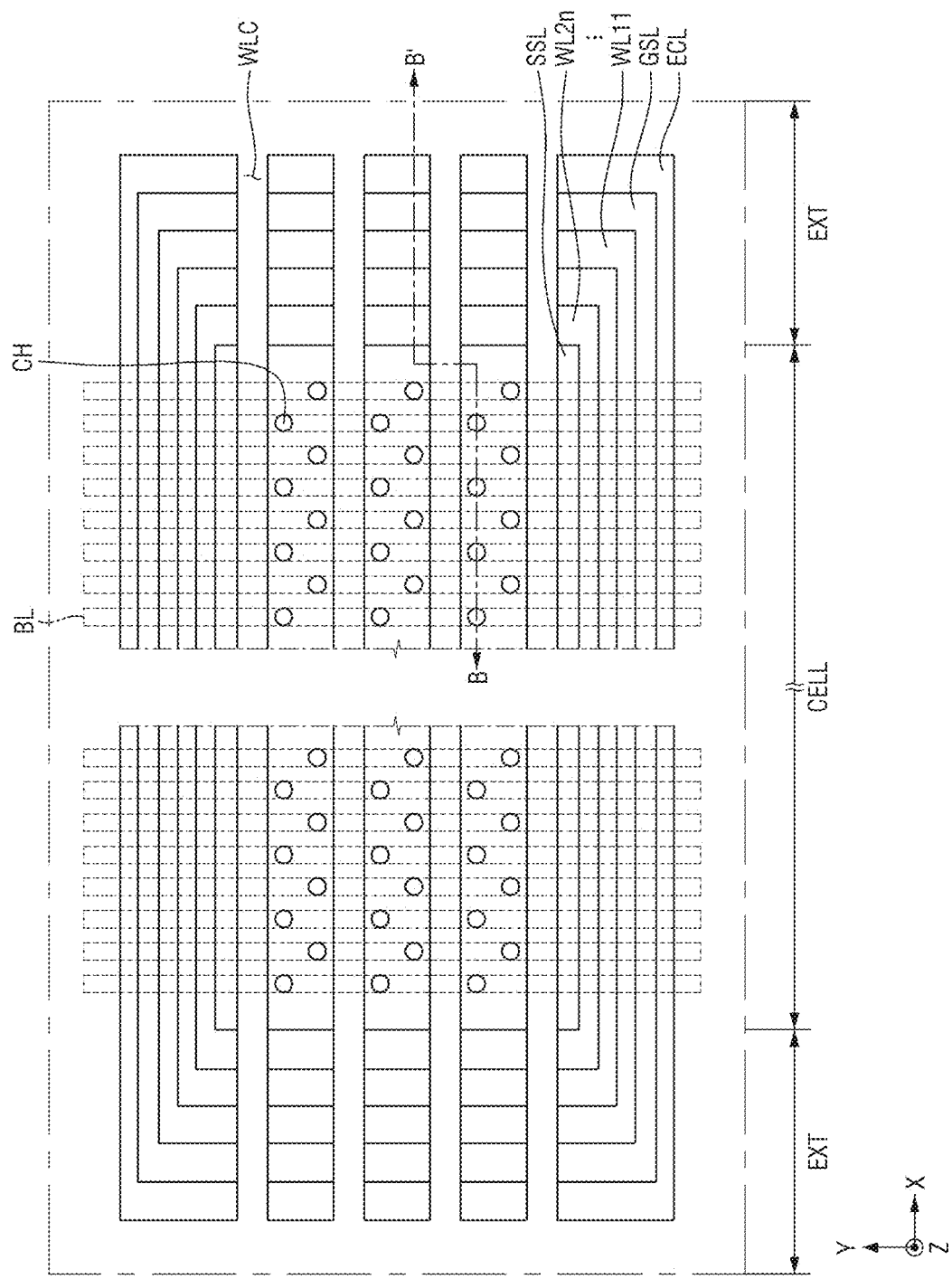
FIG. 7 is an example layout diagram for explaining a semiconductor memory device according to some embodiments.
Figure 8:
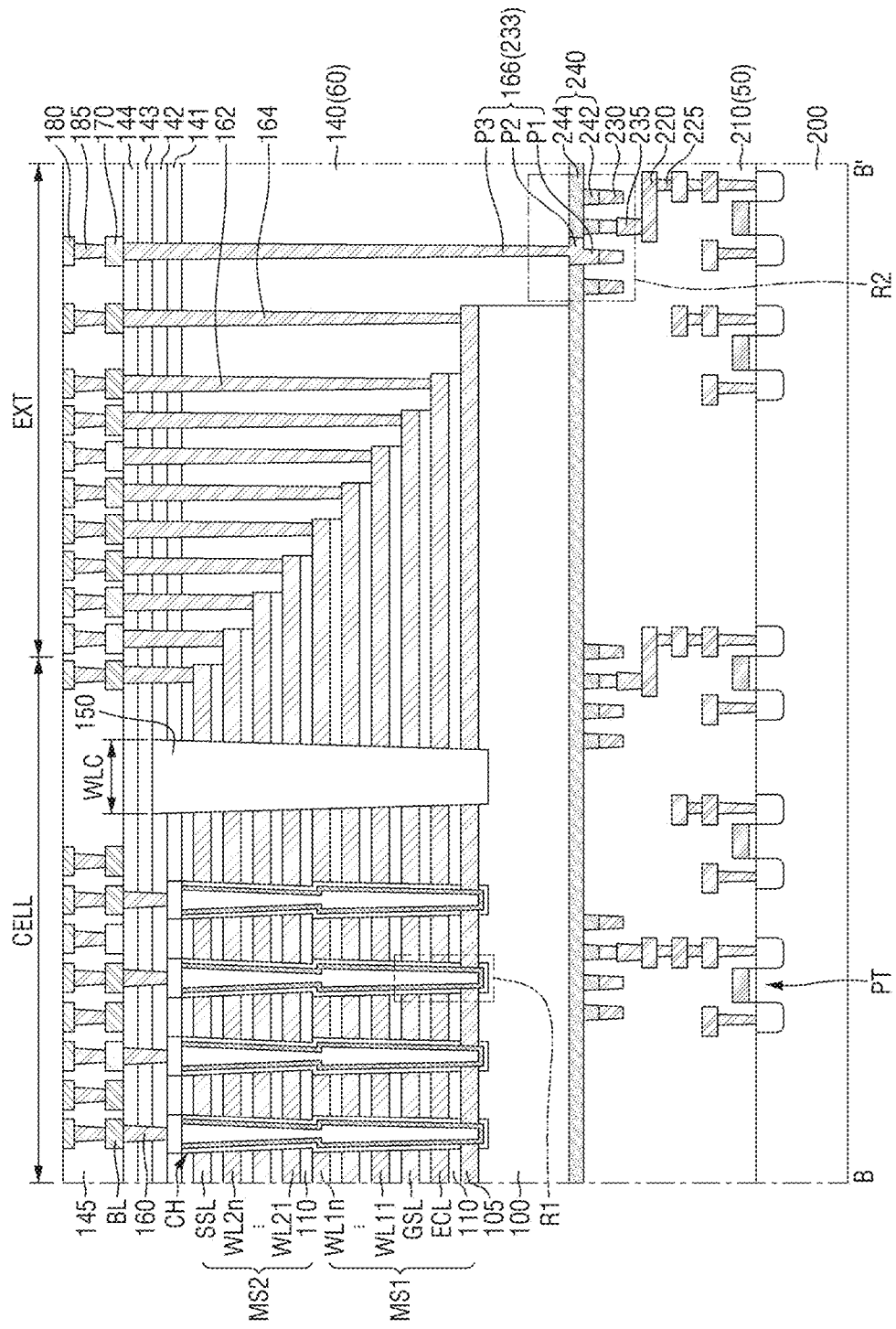
FIG. 8 is a cross-sectional view taken along a line B-B' of FIG. 7.
Figure 9:
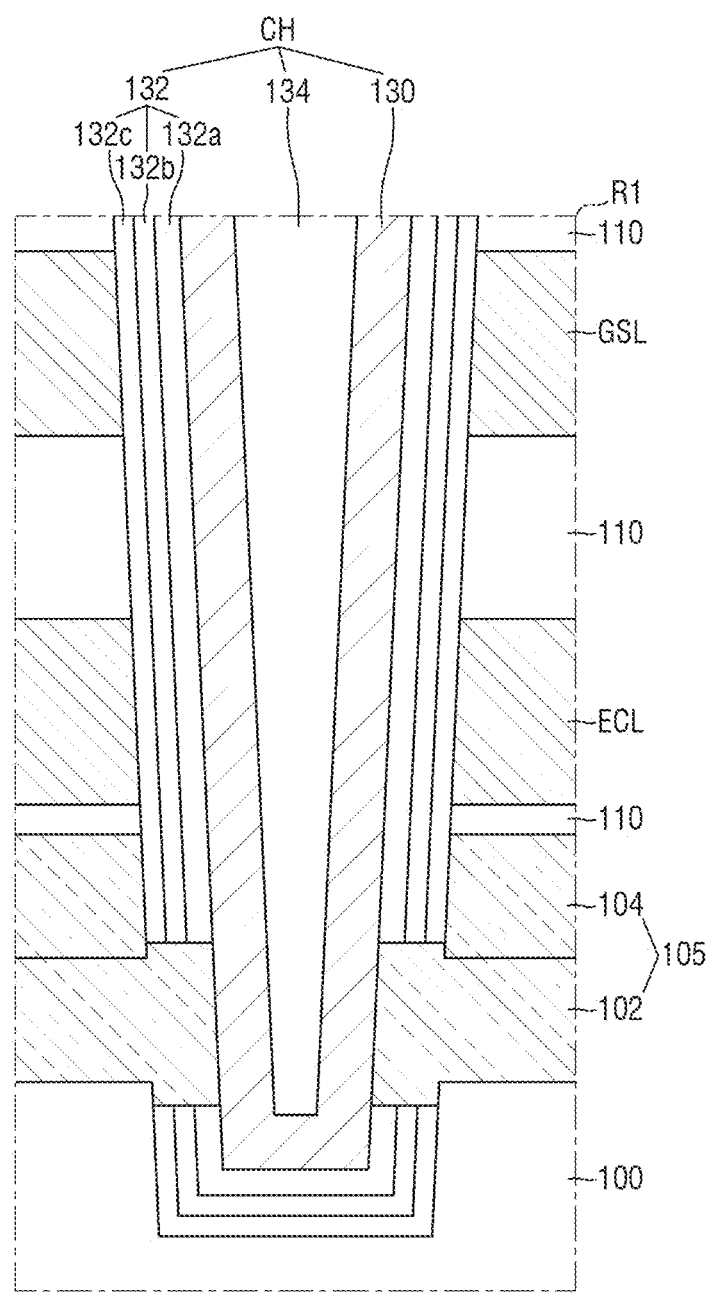
FIG. 9 is an enlarged view for explaining a region R1 of FIG. 8.
Figure 10:
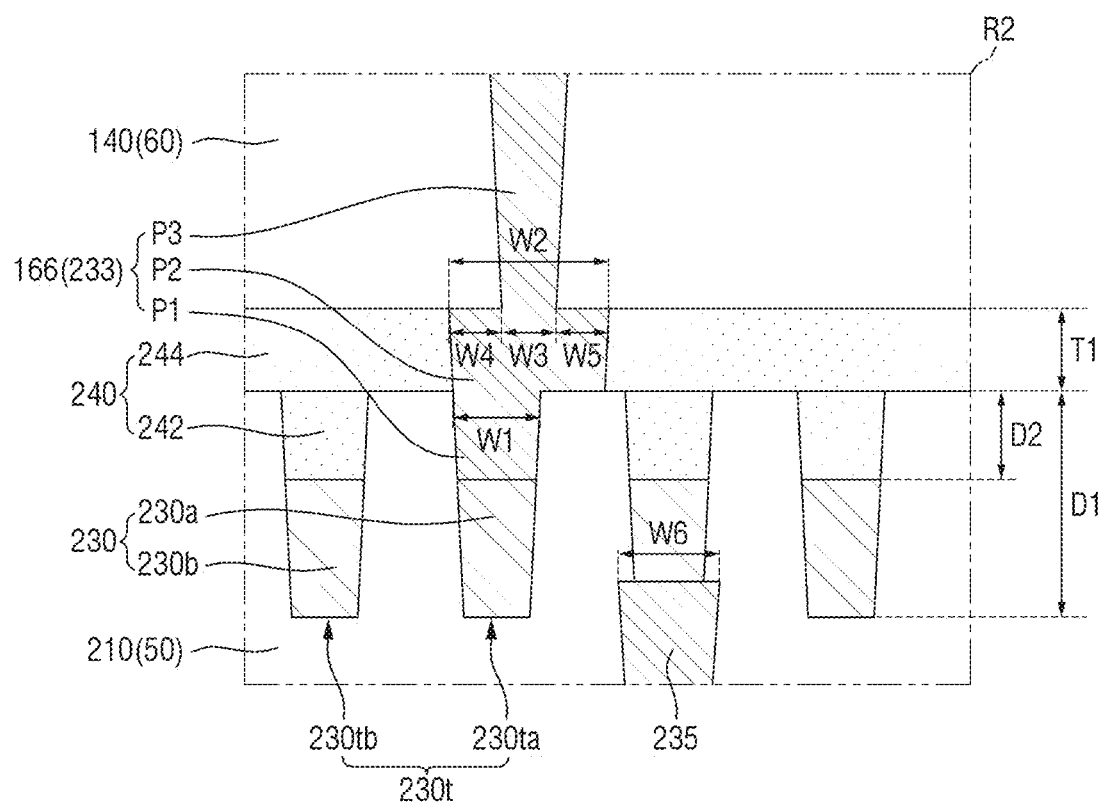
FIG. 10 is an enlarged view for explaining a region R2 of FIG. 8.

FIG. 7 is an example layout diagram for explaining a semiconductor memory device according to some embodiments. FIG. 8 is a cross-sectional view taken along a line B-B' of FIG. 7. FIG. 9 is an enlarged view for explaining a region R1 of FIG. 8. FIG. 10 is an enlarged view for explaining a region R2 of FIG. 8.

Referring to FIGS. 7 to 10, the semiconductor memory device according to some embodiments includes a first substrate 100, mold structures MS1 and MS2, a channel structure CH, a block separation region WLC, a bit line BL, a second substrate 200, a peripheral circuit element PT, a wiring pattern 230, a capping insulating film 240, and a first through contact 166.

The first substrate 100 may include, for example, a semiconductor substrate such as a silicon substrate, a germanium substrate or a silicon-germanium substrate. Alternatively, the first substrate 100 may include a silicon-on-insulator (SOI) substrate, a germanium-on-insulator (GOI) substrate, and the like. In some embodiments, the first substrate 100 may include impurities. For example, the first substrate 100 may include n-type impurities (e.g., phosphorus (P), arsenic (As), etc.). The first substrate 100 may include a cell array region CELL and an extended region EXT.

A memory cell array (e.g., 20 of FIG. 5) including a plurality of memory cells may be formed in the cell array region CELL. For example, a channel structure CH, a bit line BL, gate electrodes ECL, GSL, WL11 to WL1$n$, WL21 to WL2$n$ and SSL, and the like which will be described later, may be placed in the cell array region CELL. In the following description, a surface (e.g., an upper surface) of the first substrate 100 on which the memory cell array is placed may be referred to as a front side of the first substrate 100. In contrast, a surface (e.g., a lower surface) of the first substrate 100 opposite to the front side of the first substrate 100 may be referred to as a back side of the first substrate 100.

The extended region EXT may be placed around the cell array region CELL. The gate electrodes ECL, GSL, WL11 to WL1$n$, WL21 to WL2$n$ and SSL, which will be described later, may be stacked on the extended region EXT in a stepped manner.

The mold structures MS1 and MS2 may be formed on the front side of the first substrate 100. The mold structures MS1 and MS2 may include a plurality of gate electrodes ECL, GSL, WL11 to WL1$n$, WL21 to WL2$n$ and SSL and a plurality of mold insulating films 110 stacked on the first substrate 100.

Each of the gate electrodes ECL, GSL, WL11 to WL1$n$, WL21 to WL2$n$ and SSL and each mold insulating film 110 may have a layered structure extending parallel to the front side of the first substrate 100. The gate electrodes ECL, GSL, WL11 to WL1$n$, WL21 to WL2$n$ and SSL and the mold insulating film 110 may be alternately stacked on the first substrate 100.

In some embodiments, the mold structures MS1 and MS2 may include a first mold structure MS1 and a second mold structure MS2 that are sequentially stacked on the first substrate 100.

The first mold structure MS1 may include a plurality of first gate electrodes ECL, GSL and WL11 to WL1$n$ which are spaced apart from each other and sequentially stacked on the first substrate 100. The first gate electrodes ECL, GSL and WL11 to WL1$n$ and the mold insulating film 110 may be alternately stacked on the first substrate 100. In some embodiments, the first gate electrodes ECL, GSL and WL11 to WL1$n$ may include an erasure control line ECL, a ground selection line GSL, and a plurality of first word lines WL11 to WL1$n$ which are sequentially stacked on the first substrate 100. In some other embodiments, the erasure control line ECL may be omitted.

The second mold structure MS2 may include second gate electrodes WL21 to WL2$n$ and SSL which are spaced apart from each other and sequentially stacked on the first mold structure MS1. The second gate electrodes WL21 to WL2$n$ and SSL and the mold insulating films 110 may be alternately stacked on the first mold structure MS1. In some embodiments, the second gate electrodes WL21 to WL2$n$ and SSL may include a plurality of second word lines WL21 to WL2$n$ and a string selection line SSL which are sequentially stacked on the first mold structure MS1.

The gate electrodes ECL, GSL, WL11 to WL1$n$, WL21 to WL2$n$ and SSL may each include a conductive material. For example, the gate electrodes ECL, GSL, WL11 to WL1$n$, WL21 to WL2$n$ and SSL may each include, but are not limited to, metals such as tungsten (W), cobalt (Co) and nickel (Ni), or semiconductor materials such as silicon.

The mold insulating film 110 may include an insulating material. For example, the mold insulating film 110 may include, but is not limited to, at least one of silicon oxide, silicon nitride and silicon oxynitride.

A first interlayer insulating film 140 may be formed on the first substrate 100. The first interlayer insulating film 140 may cover the mold structures MS1 and MS2. The first interlayer insulating film 140 may include, for example, but is not limited to, at least one of silicon oxide, silicon oxynitride, and a low dielectric constant (low-k) material having a lower dielectric constant than silicon oxide.

The channel structure CH extends in a vertical direction (hereinafter, a sixth direction Z) intersecting the front side (e.g., the upper surface) of the first substrate 100 and may penetrate the mold structures MS1 and MS2. For example, the channel structure CH may have a pillar shape (e.g., a cylindrical form) extending in the sixth direction Z. Therefore, the channel structure CH may intersect each of the gate electrodes ECL, GSL, WL11 to WL1$n$, WL21 to WL2$n$ and SSL. The channel structure CH may include a semiconductor pattern 130 and an information storage film 132.

The semiconductor pattern 130 may extend in the sixth direction Z and penetrate the mold structures MS1 and MS2. Although the semiconductor pattern 130 is only shown as a cup shape, this is merely an example. For example, the semiconductor pattern 130 may have various shapes such as a cylindrical shape, a square cylinder shape, and a solid filler shape. The semiconductor pattern 130 may include, for example, but is not limited to, semiconductor materials such as single crystal silicon, polycrystalline silicon, organic semiconductor matter, and carbon nanostructures.

The information storage film 132 may be interposed between the semiconductor pattern 130 and each of the gate electrodes ECL, GSL, WL11 to WL1$n$, WL21 to WL2$n$ and SSL, and between the semiconductor pattern 130 and the stopper line DL. For example, the information storage film 132 may extend along the outer side face of the semiconductor pattern 130.

The information storage film 132 may include, for example, at least one of silicon oxide, silicon nitride, silicon oxynitride, and a high dielectric constant material having a higher dielectric constant than silicon oxide. The high dielectric constant material may include, for example, at least one of aluminum oxide, hafnium oxide, lanthanum oxide, tantalum oxide, titanium oxide, lanthanum hafnium oxide, lanthanum aluminum oxide, dysprosium scandium oxide, and combinations thereof.

In some embodiments, the information storage film 132 may be formed of a multiple film. For example, as shown in FIG. 9, the information storage film 132 may include a tunnel insulating film 132$a$, a charge storage film 132$b$, and a blocking insulating film 132$c$ that are sequentially stacked on the outer side of the semiconductor pattern 130.

The tunnel insulating film 132$a$ may include, for example, silicon oxide or a high dielectric constant material having a higher dielectric constant than silicon oxide (e.g., aluminum oxide ($Al_2O_3$) and hafnium oxide ($HfO_2$)). The charge storage film 132b may include, for example, silicon nitride. The blocking insulating film 132c may include, for example, silicon oxide or a high dielectric constant material having a higher dielectric constant than silicon oxide (e.g., aluminum oxide ($Al_2O_3$) and hafnium oxide ($HfO_2$)).

In some embodiments, the channel structure CH may further include a filling pattern 134. The filling pattern 134 may be formed to fill the inside of the cup-shaped semiconductor pattern 130. The filling pattern 134 may include, but is not limited to, insulating materials, for example, silicon oxide.

In some embodiments, the channel structure CH may further include a channel pad 136. The channel pad 136 may be formed to be connected to the semiconductor pattern 130. For example, the second interlayer insulating film 141 may be formed on the first interlayer insulating film 140. The channel pad 136 is formed inside the second interlayer insulating film 141 and may be connected to the upper part of the semiconductor pattern 130. The channel pad 136 may include, for example, but is not limited to, impurity-doped polysilicon.

In some embodiments, the plurality of channel structures CH may be arranged in zigzags. For example, as shown in FIG. 7, the plurality of channel structures CH may be arranged alternately with each other in the fourth direction X and the fifth direction Y. The plurality of channel structures CH arranged in zigzags may further improve the degree of integration of the semiconductor memory device. In some embodiments, the plurality of channel structures CH may be arranged in the form of honeycombs.

Although the channel structures CH are only shown as being formed inside the mold structures MS1 and MS2 of the cell array region CELL, this is merely for convenience of explanation. For example, in order to reduce the stress applied to the mold structures MS1 and MS2, a dummy channel structure of a shape similar to that of the channel structure CH may be formed inside the mold structures MS1 and MS2 of the extended region EXT. Such a dummy channel structure extends in the sixth direction Z and may penetrate the first interlayer insulating film 140 and the mold structures MS1 and MS2.

In some embodiments, a first source structure 105 may be formed on the first substrate 100. The first source structure 105 may be interposed between the first substrate 100 and the mold structures MS1 and MS2. For example, the first source structure 105 may extend along the front side of the first substrate 100. The first source structure 105 may include, for example, but is not limited to, impurity-doped polysilicon or metal.

The first source structure 105 may be formed to be connected to the semiconductor pattern 130 of the channel structure CH. For example, as shown in FIG. 9, the first source structure 105 may penetrate the information storage film 132 and come into contact with the semiconductor pattern 130. Such a first source structure 105 may be provided as a common source line (e.g., CSL of FIG. 6) of the semiconductor memory device. In some embodiments, the channel structure CH may penetrate the first source structure 105. For example, the lower part of the channel structure CH penetrates the first source structure 105, and may be buried inside the first substrate 100.

In some embodiments, the first source structure 105 may be formed of a multiple film. For example, as shown in FIG. 9, the first source structure 105 may include a first semiconductor film 102 and a second semiconductor film 104 that are sequentially stacked on the first substrate 100. The first semiconductor film 102 and the second semiconductor film 104 may each include impurity-doped polysilicon or impurity-undoped polysilicon. The first semiconductor film 102 is in contact with the semiconductor pattern 130 and may be provided as a common source line (e.g., CSL of FIG. 6) of the semiconductor memory device. The second semiconductor film 104 may be used as a support layer for limiting and/or preventing the mold stack from collapsing or falling in a replacement process for forming the first semiconductor film 102.

Although not shown, a base insulating film may be interposed between the first substrate 100 and the first source structure 105. The base insulating film may include, for example, but is not limited to, at least one of silicon oxide, silicon nitride and silicon oxynitride.

A block separation region WLC extends in the fourth direction X which intersects the sixth direction Z (for example, parallel to the front side of the first substrate 100) and may cut the mold structures MS1 and MS2. The mold structures MS1 and MS2 may be cut by a plurality of block separation regions WLC to form a plurality of memory cell blocks (e.g., BLK1 to BLKn of FIG. 5). A plurality of channel structures CH may be placed inside each of the memory cell blocks (e.g., BLK1 to BLKn of FIG. 5). It goes without saying that the number of channel structures CH placed in each of the cell blocks (e.g., BLK1 to BLKn of FIG. 5) is not limited to that shown and may vary.

In some embodiments, the block separation region WLC may include an insulating pattern 150. The insulating pattern 150 may be formed to fill the block separation region WLC. For example, a third interlayer insulating film 142 may be formed on the second interlayer insulating film 141. The insulating pattern 150 may extend in the fourth direction X to cut the mold structures MS1 and MS2 and the first to third interlayer insulating films 140, 141 and 142. The insulating pattern 150 may include, for example, but is not limited to, at least one of silicon oxide, silicon nitride and silicon oxynitride. As an example, the insulating pattern 150 may include silicon oxide.

The bit line BL may be formed on the mold structures MS1 and MS2. For example, a fourth interlayer insulating film 143 and a fifth interlayer insulating film 144 may be sequentially formed on the third interlayer insulating film 142. The bit line BL may be formed on the fifth interlayer insulating film 144. The bit line BL may intersect the block separation region WLC. For example, the bit line BL may extend in a fifth direction Y which intersects a sixth direction Z (for example, parallel to the front side of the first substrate 100) and intersects the fourth direction X.

The bit line BL may be connected to each channel structure CH. For example, a bit line contact 160 that penetrates the third to fifth interlayer insulating films 142 to 144 and is connected to the upper surfaces of each channel structure CH may be formed. The bit line BL may be electrically connected to each channel structure CH through the bit line contact 160.

Each of the gate electrodes ECL, GSL, WL11 to WL1n, WL21 to WL2n and SSL may be connected to the gate contact 162 inside the extended region EXT. For example, the gate contact 162 penetrates the first to fifth interlayer insulating films 140 to 144, and may be connected to each of the gate electrodes ECL, GSL, WL11 to WL1n, WL21 to WL2n and SSL.

The first source structure 105 may be connected to the source contact 164. For example, the source contact 164 penetrates the first to fifth interlayer insulating films 140 to 144, and may be connected to the first source structure 105.

The gate contact 162 and/or the source contact 164 may be connected to the connecting line 170 on the fifth interlayer insulating film 144. The connecting line 170 may be electrically connected to each of the gate electrodes ECL, GSL, WL11 to WL1n, WL21 to WL2n, and SSL through the gate contact 162, and may be electrically connected to the first source structure 105 through the source contact 164.

The bit line BL and/or the connecting line 170 may be connected to the first wiring structures 180 and 185. For example, a first inter-wiring insulating film 145 may be formed on the fifth interlayer insulating film 144. The first wiring structures 180 and 185 are formed inside the first inter-wiring insulating film 145, and may be electrically connected to the bit line BL and/or the connecting line 170. The first wiring structure 180 and 185 may include, for example, a cell array wiring 180, and a first connection via 185 that connects the cell array wiring 180 to the bit line BL and/or the connecting line 170. Although the cell array wiring 180 is only shown as being formed of a single layer, this is merely an example, and it goes without saying that the cell array wiring 180 may be formed of multiple layers.

The second substrate 200 may include, for example, a semiconductor substrate such as a silicon substrate, a germanium substrate or a silicon-germanium substrate. Alternatively, the second substrate 200 may include a silicon-on-insulator (SOI) substrate, a germanium-on-insulator (GOI) substrate, and the like.

The peripheral circuit element PT may be formed on the second substrate 200. The peripheral circuit element PT may form a peripheral circuit (e.g., 30 of FIG. 5) that controls the operation of the semiconductor memory device. For example, the peripheral circuit element PT may include a control logic (e.g., 37 of FIG. 5), a row decoder (e.g., 33 of FIG. 5), a page buffer (e.g., 35 of FIG. 5), and the like. In the following description, the surface (e.g., the upper surface) of the second substrate 200 on which the peripheral circuit element PT is placed may be referred to as a front side of the second substrate 200. In contrast, the surface (e.g., a lower surface) of the second substrate 200 opposite to the front side of the second substrate 200 may be referred to as a back side of the second substrate 200.

The peripheral circuit element PT may include, for example, but is not limited to, a transistor. For example, the peripheral circuit element PT may include not only various active elements such as a transistor, but also various passive elements such as a capacitor, a resistor and an inductor.

In some embodiments, the back side of the first substrate 100 may face the front side of the second substrate 200. For example, a second inter-wiring insulating film 210 that covers the peripheral circuit element PT may be formed on the front side of the second substrate 200. The first substrate 100 may be stacked on the upper surface of the second inter-wiring insulating film 210.

In some embodiments, the first wiring structures 180 and 185 may be connected to the peripheral circuit element PT through a first through contact 166. For example, the second wiring structures 220 and 225 connected to the peripheral circuit element PT may be formed inside the second inter-wiring insulating film 210. The second wiring structures 220 and 225 may include, for example, a peripheral circuit wiring 220 formed of multiple layers, and a second connecting via 225 that interconnects the peripheral circuit wirings 220 or connects the peripheral circuit wiring 220 to the peripheral circuit element PT. The first through contact 166 may penetrate the first to fifth interlayer insulating films 140 to 144 to connect the first wiring structures 180 and 185 and the second wiring structures 220 and 225. Accordingly, the bit line BL, each of the gate electrodes ECL, GSL, WL11 to WL1n, WL21 to WL2n and SSL and/or the first source structure 105 may be electrically connected to the peripheral circuit element PT.

In some embodiments, the wiring pattern 230 may be formed inside the second inter-wiring insulating film 210, and the capping insulating film 240 may cover at least a part of the upper surface of the second inter-wiring insulating film 210. That is, the second inter-wiring insulating film 210 may correspond to the lower insulating film 50 described above in the description of FIGS. 1 to 4E. The wiring pattern 230 may be electrically connected to the peripheral circuit element PT. For example, the wiring pattern 230 may be connected to the second wiring structures 220 and 225 through the lower contact 235.

In some embodiments, the first interlayer insulating film 140 may cover at least a part of the upper surface of the capping insulating film 240. That is, the first interlayer insulating film 140 may correspond to the upper insulating film 60 described above in the description of FIGS. 1 to 4E. In some embodiments, the first interlayer insulating film 140 may cover a part of the upper surface of the capping insulating film 240, and the first substrate 100 may cover the other part of the upper surface of the capping insulating film 240.

In some embodiments, the first through contact 166 may penetrate the capping insulating film 240 and be connected to at least a part of the wiring pattern 230 (e.g., the first wiring 230a). The first through contact 166 may include a contact recess portion P1, an extended portion P2, and a plug portion P3. That is, the first through contact 166 may correspond to the upper contact 233 described above in the description of FIGS. 1 to 4E. Accordingly, the bit line BL, each of the gate electrodes ECL, GSL, WL11 to WL1n, WL21 to WL2n and SSL and/or the first source structure 105 may be electrically connected to the peripheral circuit element PT.

Accordingly, it is possible to provide a semiconductor memory device including a semiconductor device having improved product reliability and yield.

FIGS. 11 to 14 are various other cross-sectional views for explaining a semiconductor memory device according to some embodiments. For convenience of explanation, repeated parts of contents explained using FIGS. 1 to 10 will be briefly described or omitted.

Figure 11:
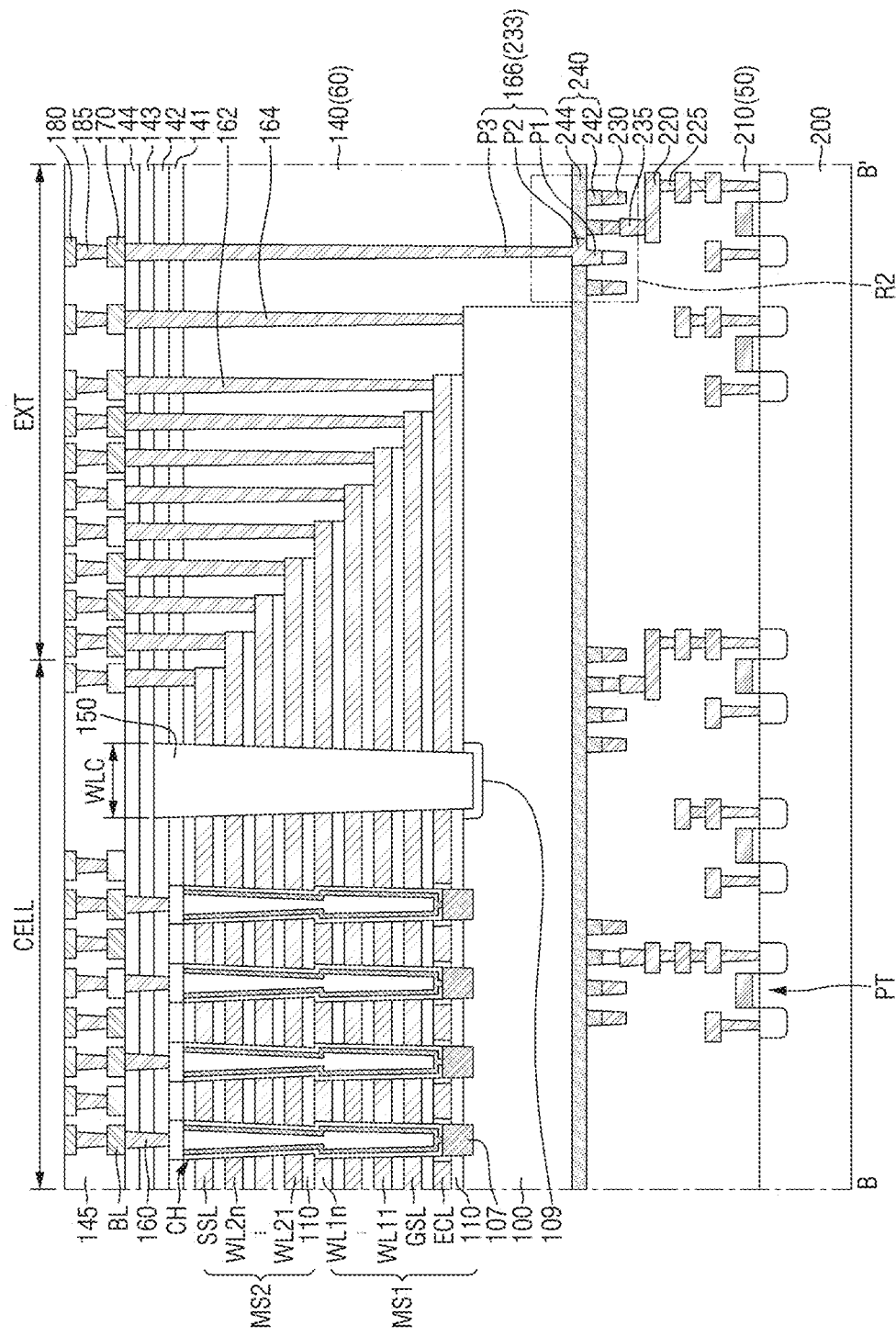
FIGS. 11 to 14 are various other cross-sectional views for explaining a semiconductor memory device according to some embodiments.

Referring to FIG. 11, the semiconductor memory device according to some embodiments includes a second source structure 107.

The second source structure 107 may be formed on the first substrate 100. The second source structure 107 may be formed to be connected to the channel structure CH. For example, the lower part of the channel structure CH may come into contact with the upper surface of the second source structure 107. The second source structure 107 may include, but is not limited to, polysilicon that has epitaxially grown from the first substrate 100. In some embodiments, the upper surface of the second source structure 107 may be formed to be higher than the upper surface of the first substrate 100. For example, the upper surface of the second source structure 107 may be formed to be higher than the lower surface of the erasure control line ECL.

In some embodiments, an impurity region 109 may be further formed inside the first substrate 100. The impurity region 109 may include, but is not limited to, impurity-doped polysilicon. The impurity region 109 extends in the fourth direction X and may overlap the block separation region WLC. Such an impurity region 109 may be provided as a common source line (e.g., CSL of FIG. 6) of the semiconductor memory device. In this case, the first source structure 105 described above in the description of FIGS. 8 and 9 may be omitted.

Figure 12:
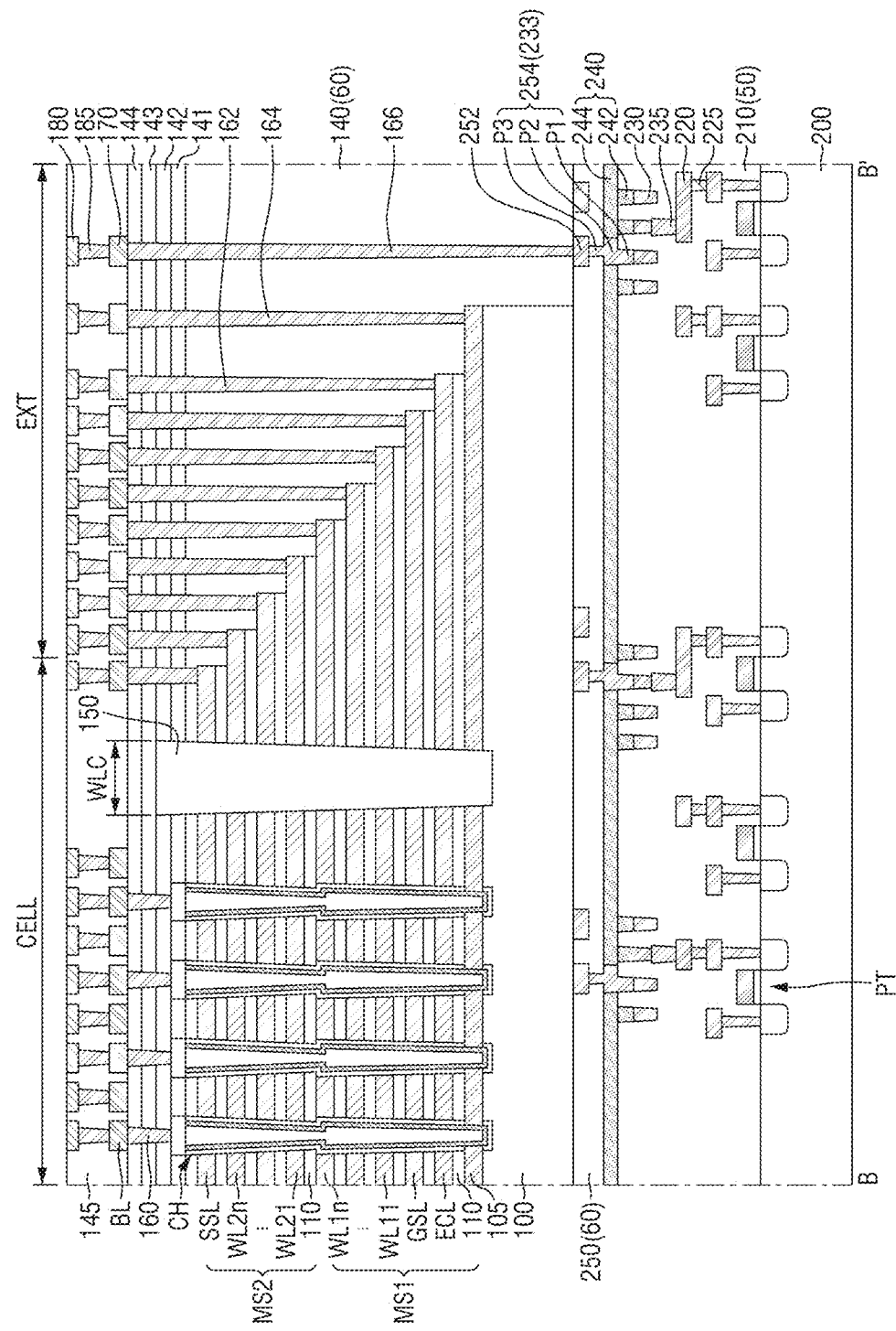

Referring to FIG. 12, the semiconductor memory device according to some embodiments includes a third inter-wiring insulating film 250 and a second through contact 254.

The third inter-wiring insulating film 250 may be interposed between the capping insulating film 240 and the first interlayer insulating film 140, and between the capping insulating film 240 and the first substrate 100. For example, the third inter-wiring insulating film 250 may cover the upper surface of the capping insulating film 240. That is, the third inter-wiring insulating film 250 may correspond to the upper insulating film 60 described above in the description of FIGS. 1 to 4E.

The second through contact 254 penetrates the capping insulating film 240 and may be connected to at least a part (e.g., the first wiring 230a) of the wiring pattern 230. The second through contact 254 may include a contact recess portion P1, an extended portion P2, and a plug portion P3. That is, the second through contact 254 may correspond to the upper contact 233 described above in the description of FIGS. 1 to 4E.

In some embodiments, the second through contact 254 may be connected to the third wiring structure 252 inside the third inter-wiring insulating film 250. The second through contact 254 may connect the wiring pattern 230 and the third wiring structure 252. Accordingly, the bit line BL, each of the gate electrodes ECL, GSL, WL11 to WL1n, WL21 to WL2n and SSL and/or the first source structure 105 may be electrically connected to the peripheral circuit element PT.

Figure 13:
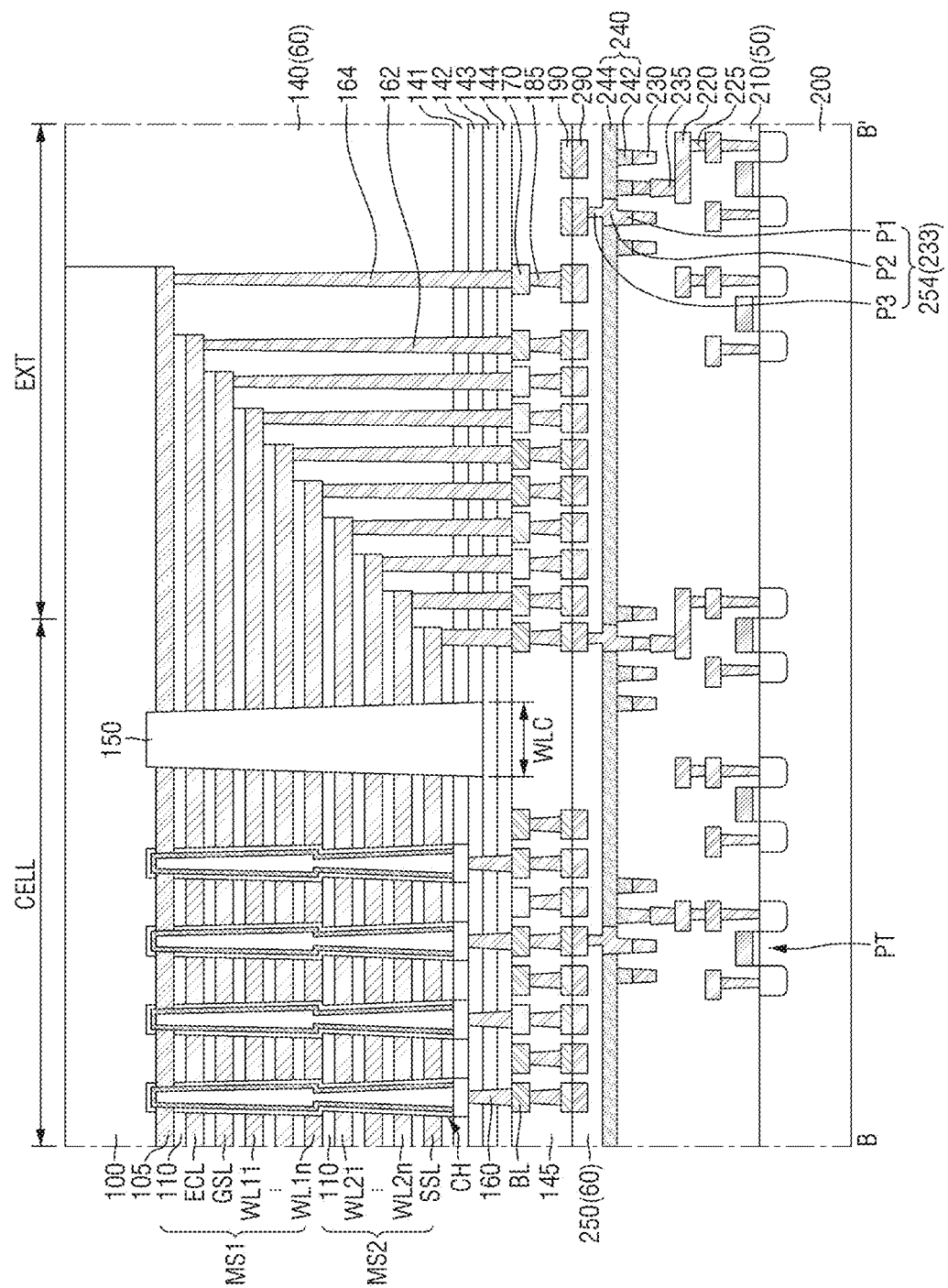

Referring to FIG. 13, in the semiconductor memory device according to some embodiments, the front side of the first substrate 100 faces the front side of the second substrate 200.

For example, the semiconductor memory device according to some embodiments may have a C2C (chip to chip) structure. The C2C structure means a structure in which an upper chip including a cell array region is fabricated on a first wafer (e.g., the first substrate 100), a lower chip including a peripheral circuit region is fabricated on a second wafer (e.g., the second substrate 200) different from the first wafer, and then, the upper chip and the lower chip are connected to each other by a bonding method.

As an example, the bonding method may mean a method which electrically connects a first bonding metal 190 formed on an uppermost metal layer of the upper chip and a second bonding metal 290 formed on an uppermost metal layer of the lower chip. For example, when the first bonding metal 190 and the second bonding metal 290 are formed of copper (Cu), the bonding method may be a Cu—Cu bonding method. However, this is merely an example, and it goes without saying that the first bonding metal 190 and the second bonding metal 290 may be formed of various other metals such as aluminum (Al) or tungsten (W).

As the first bonding metal 190 and the second bonding metal 290 are connected, the first wiring structure 180 and 185 may be connected to the second wiring structures 220 and 225. Therefore, each of the gate electrodes ECL, GSL, WL11 to WL1n, WL21 to WL2n and SSL and/or the first source structure 105 may be electrically connected to the peripheral circuit element PT.

In some embodiments, the second through contact 254 may be connected to the second bonding metal 290 inside the third inter-wiring insulating film 250. The second through contact 254 may connect the wiring pattern 230 and the second bonding metal 290. Accordingly, the bit line BL, each of the gate electrodes ECL, GSL, WL11 to WL1n, WL21 to WL2n and SSL and/or the first source structure 105 may be electrically connected to the peripheral circuit element PT.

Figure 14:
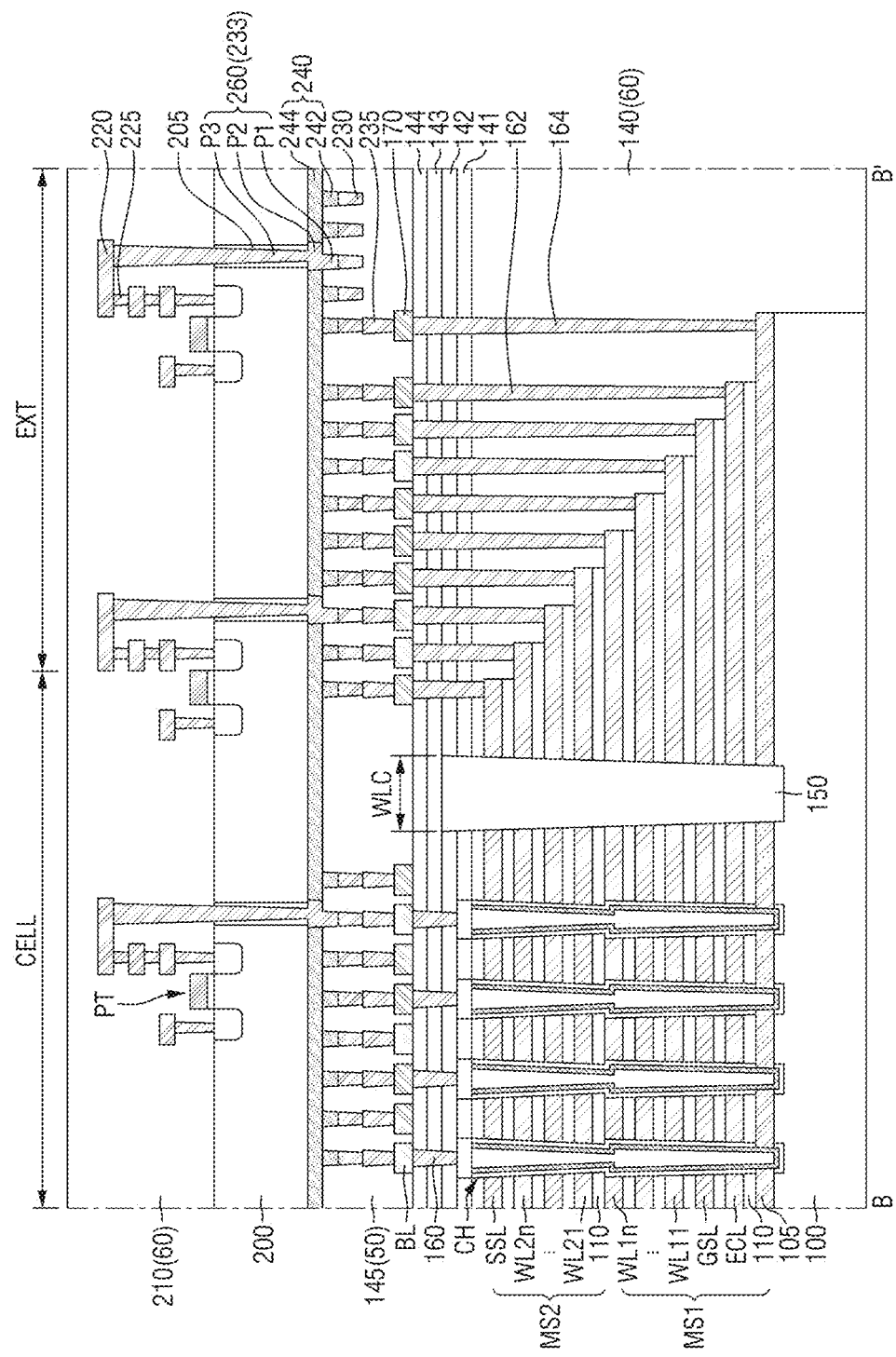

Referring to FIG. 14, in the semiconductor memory device according to some embodiments, the front side of the first substrate 100 faces the back side of the second substrate 200. For example, the second substrate 200 may be stacked on the upper surface of the first inter-wiring insulating film 145.

In some embodiments, the wiring pattern 230 may be formed inside the first inter-wiring insulating film 145, and the capping insulating film 240 may cover at least a part of the upper surface of the first inter-wiring insulating film 145. That is, the first inter-wiring insulating film 145 may correspond to the lower insulating film 50 described above in the description of FIGS. 1 to 4E. The wiring pattern 230 may be electrically connected to the bit line BL and/or the connecting line 170. For example, the wiring pattern 230 may be connected to the bit line BL and/or the connecting line 170 through the lower contact 235.

In some embodiments, a third through contact 260 that penetrates the second substrate 200 and is connected to at least a part (e.g., the first wiring 230a) of the wiring pattern 230 may be formed. The third through contact 260 may include a contact recess portion P1, an extended portion P2, and a plug portion P3. That is, the third through contact 260 may correspond to the upper contact 233 described above in the description of FIGS. 1 to 4E. The third through contact 260 may connect the wiring pattern 230 and the second wiring structures 220 and 225. Accordingly, the bit line BL, each of the gate electrodes ECL, GSL, WL11 to WL1n, WL21 to WL2n and SSL and/or the first source structure 105 may be electrically connected to the peripheral circuit element PT.

In some embodiments, the contact insulating film 205 may be interposed between the second substrate 200 and the third through contact 260. The contact insulating film 205 may extend along the side face of the third through contact 260 inside the second substrate 200. The contact insulating film 205 may electrically insulate the third through contact 260 from the second substrate 200.

Hereinafter, a method for fabricating a semiconductor device including the semiconductor device according to an example embodiment will be described referring to FIGS. 1 to 4E and 15 to 21.

FIGS. 15 to 21 are intermediate process diagrams for explaining the method for fabricating the semiconductor device according to some embodiments. For convenience of explanation, repeated parts of contents explained using FIGS. 1 to 4E will be briefly described or omitted.

Figure 15:
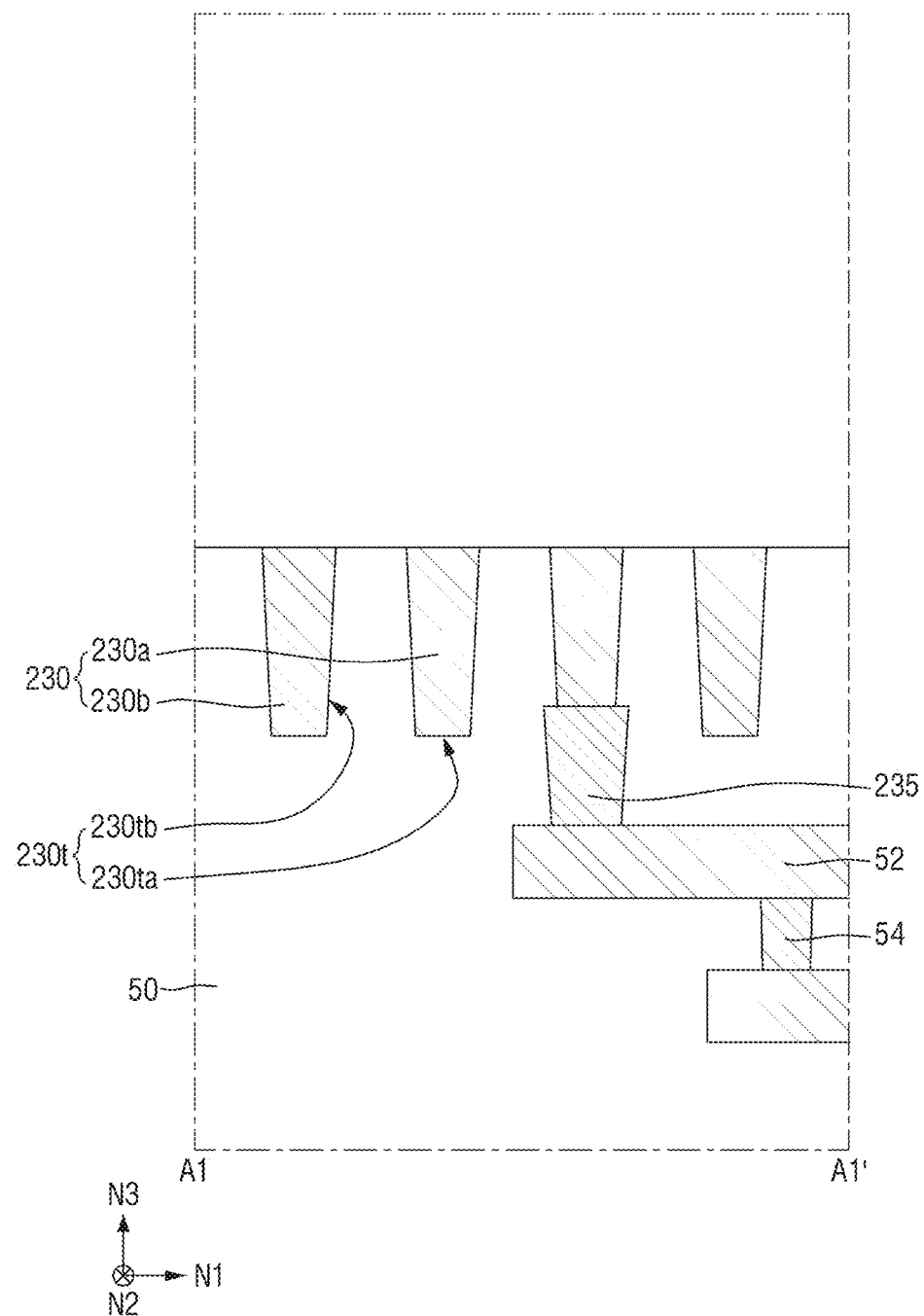
FIGS. 15 to 21 are intermediate process diagrams for explaining the method for fabricating the semiconductor device according to some embodiments.

Referring to FIG. 15, the wiring pattern 230 is formed inside the lower insulating film 50.

For example, the lower insulating film 50, and the lower wiring structures 52 and 54 and the lower contact 235 inside the lower insulating film 50 may be provided on a substrate (not shown). Next, a wiring trench 230t may be formed inside the lower insulating film 50. The wiring pattern 230 may be formed to fill the wiring trench 230t. The wiring trench 230t may expose at least a part of the lower contact 235. Accordingly, the wiring pattern 230 connected to the lower contact 235 may be formed.

Figure 16:
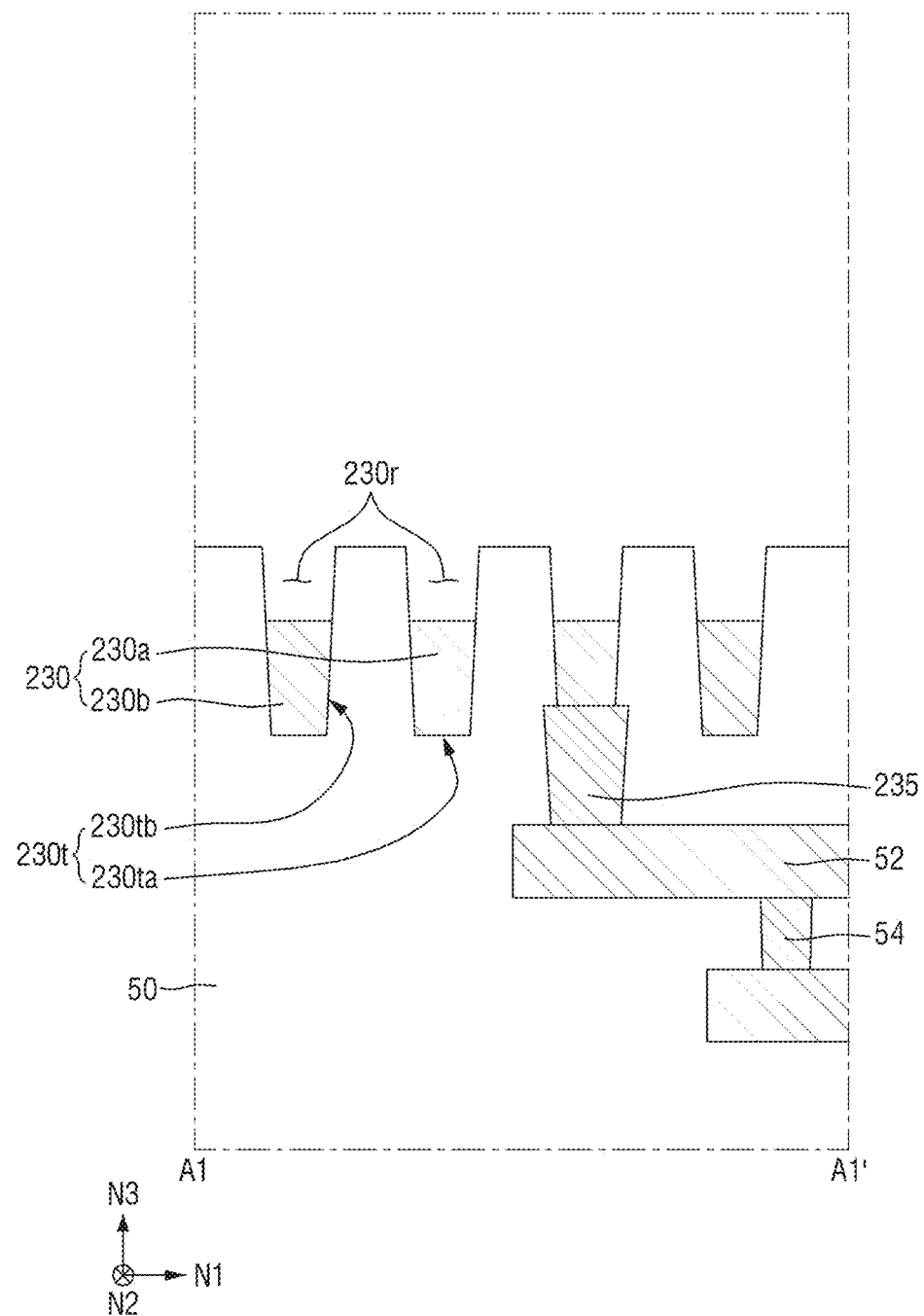

Referring to FIG. 16, the upper part of the wiring pattern 230 is removed.

For example, a recess process of the wiring pattern 230 may be performed. A recess 230r may be formed inside the wiring trench 230t by the recess process. Accordingly, the upper surface of the wiring pattern 230 may be formed to be lower than the upper surface of the lower insulating film 50. The recess process may include, for example, but is not limited to, a wet etching process.

Figure 17:
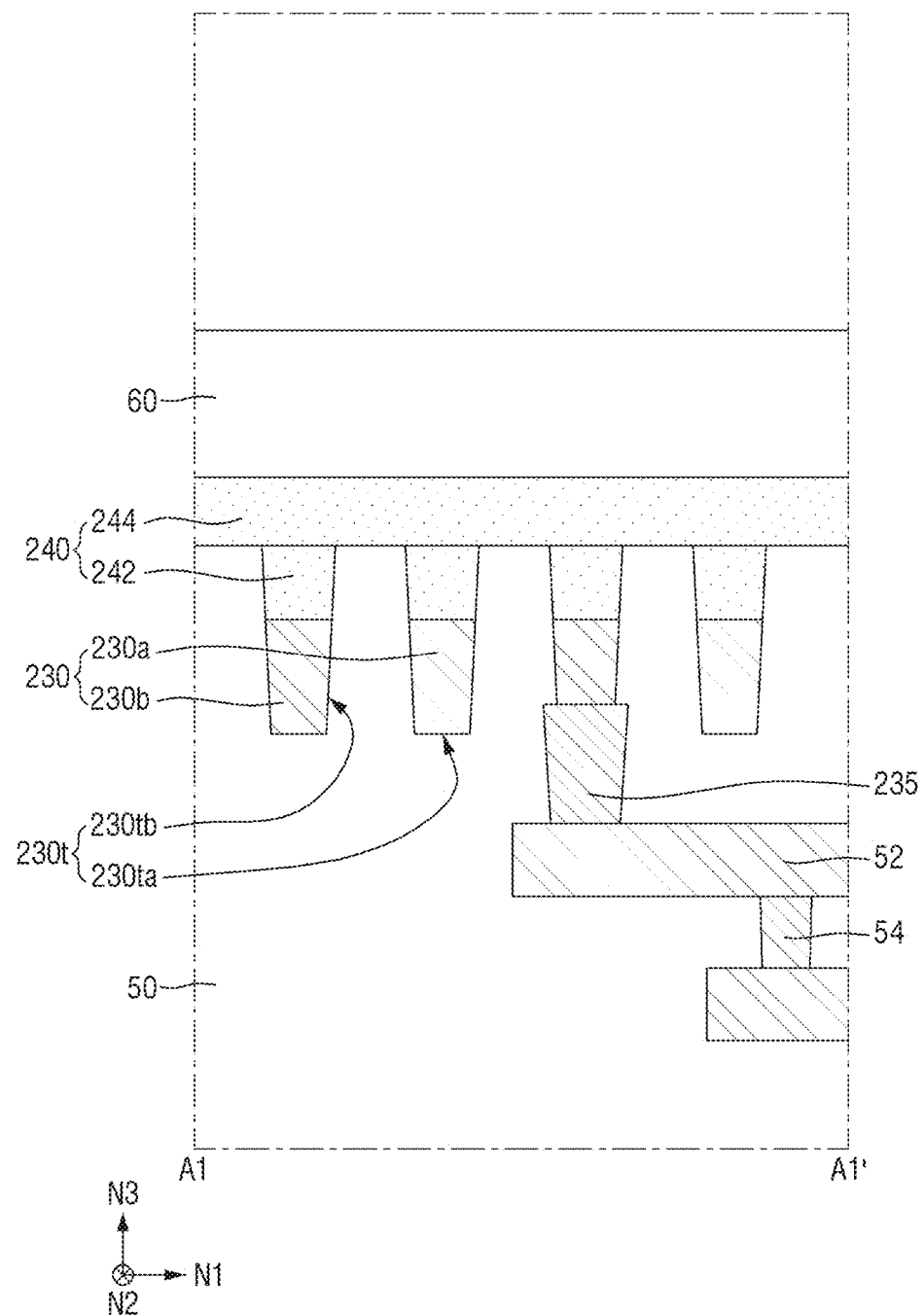

Referring to FIG. 17, the capping insulating film 240 is formed on the lower insulating film 50.

For example, an insulating material that covers the upper surface of the lower insulating film 50 may be formed. The insulating material may be formed to fill the recess 230r of FIG. 16. Next, a flattening process of the insulating material may be performed. The flattening process may include, for example, but is not limited to, a chemical mechanical polishing (CMP) process. Accordingly, the capping insulating film 240, which includes the insulating recess portion 242 that fills the recess 230r of FIG. 16 and the insulating liner portion 244 that covers the upper surface of the lower insulating film 50, may be formed. The insulating liner portion 244 may be formed after formation of the insulating recess portion 242, or may be formed together with the insulating recess portion 242.

After forming the capping insulating film 240, the upper insulating film 60 that covers the capping insulating film 240 may be formed.

Figure 18:
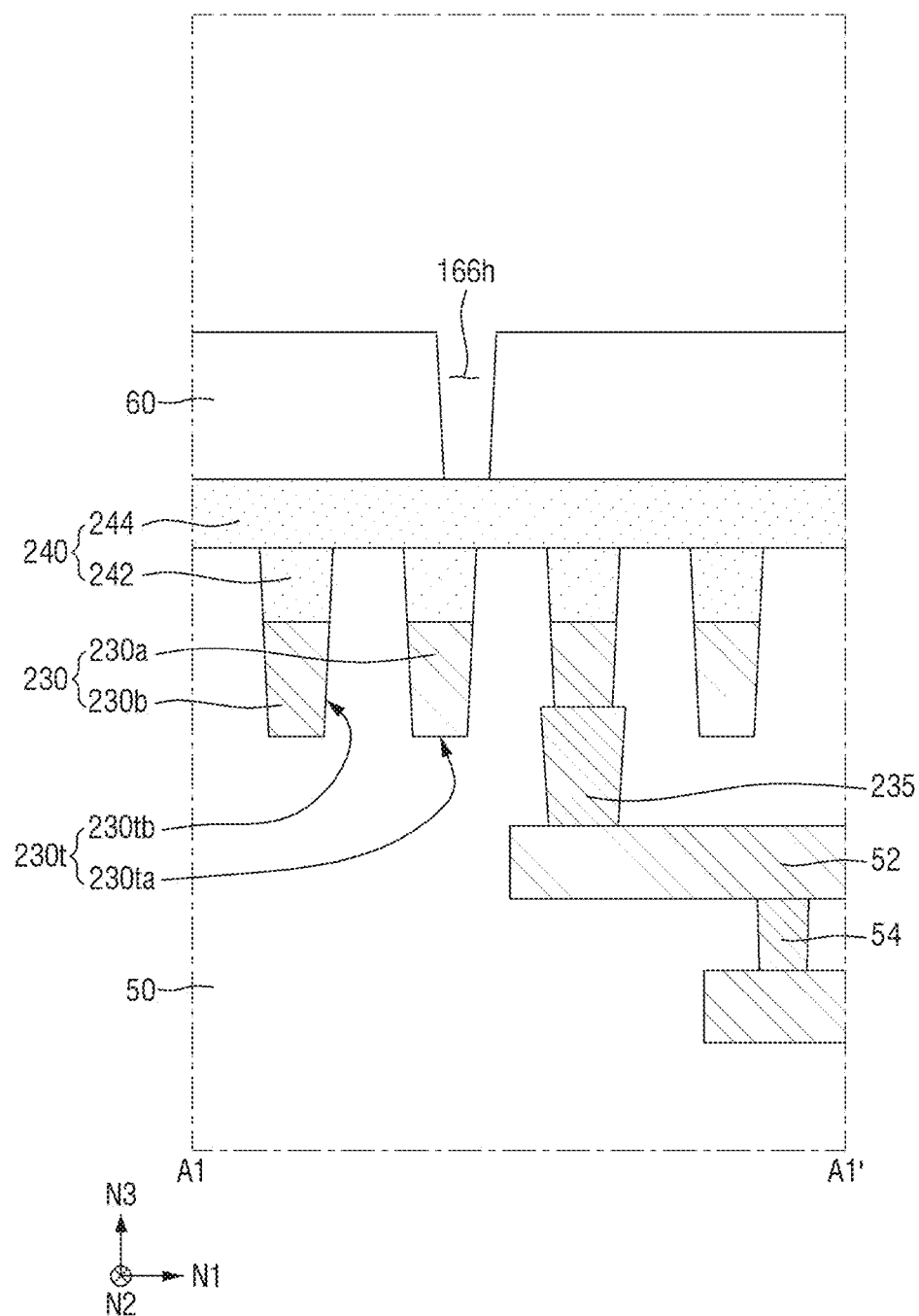

Referring to FIG. 18, a contact hole 166h is formed inside the upper insulating film 60.

The contact hole 166h may expose a part of the upper surface of the capping insulating film 240. For example, a first anisotropic etching process of etching the upper insulating film 60 using the capping insulating film 240 as an etch stop layer may be performed. The first anisotropic etching process may include, for example, but is not limited to, a dry etching process.

In some embodiments, the upper insulating film 60 may include an insulating material having an etching selectivity with respect to the capping insulating film 240. As an example, the capping insulating film 240 may include silicon nitride, and the upper insulating film 60 may include silicon oxide. Accordingly, the capping insulating film 240 may function as an etch stop layer for the first anisotropic etching process.

Figure 19:
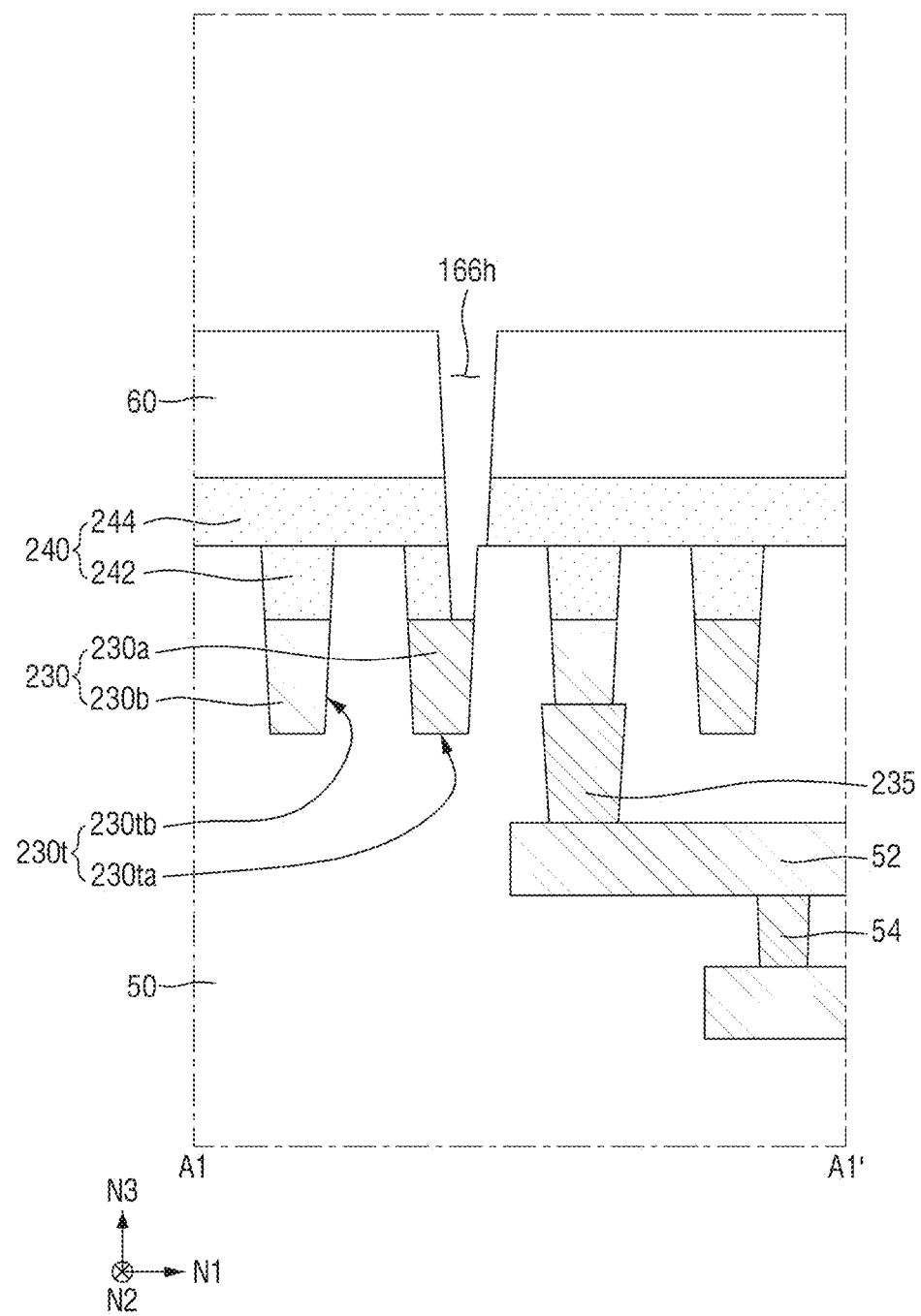

Referring to FIG. 19, a contact hole 166h that penetrates the capping insulating film 240 and exposes at least a part of the wiring pattern 230 is formed.

For example, a second anisotropic etching process of etching the capping insulating film 240 exposed by the first anisotropic etching process to expose a part of the upper surface of the first wiring 230a may be performed. The second anisotropic etching process may include, for example, but is not limited to, a dry etching process.

In some embodiments, the capping insulating film 240 may include an insulating material having an etching selectivity with respect to the lower insulating film 50. As an example, the lower insulating film 50 may include silicon oxide, and the capping insulating film 240 may include silicon nitride.

Figure 20:
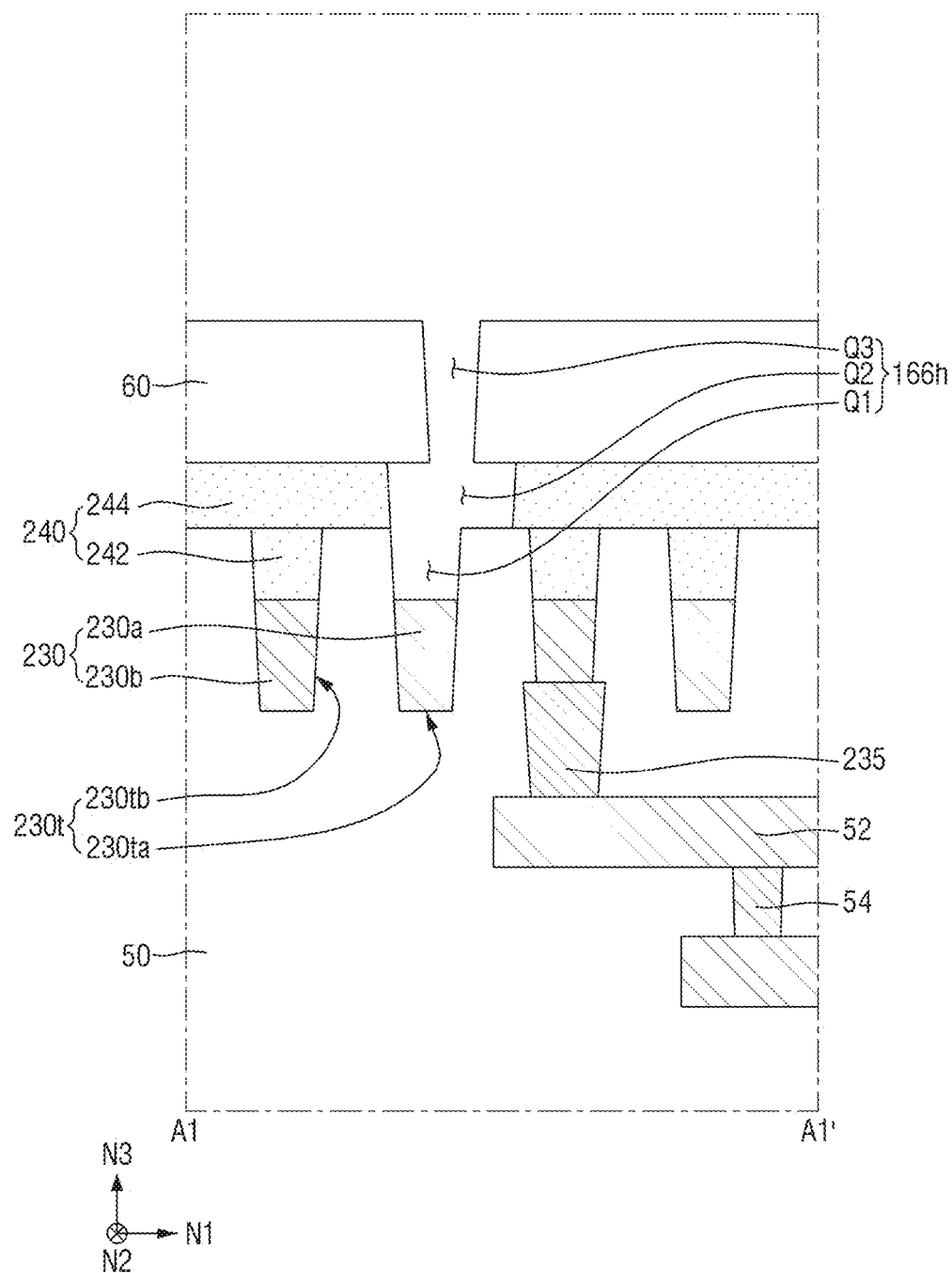

Referring to FIG. 20, a part of the capping insulating film 240 exposed by the contact hole 166h is removed.

For example, an isotropic etching process may be performed on the capping insulating film 240. The isotropic etching process may include, for example, but is not limited to, a dry etching process. Accordingly, the contact hole 166h including a first portion Q1, a second portion Q2, and a third portion Q3 may be formed. The first portion Q1 and the second portion Q2 may penetrate the capping insulating film 240 and expose the first wiring 230a. The first portion Q1 may be formed inside the insulating recess portion 242, and the second portion Q2 may be formed inside the insulating liner portion 244. The third portion Q3 may be formed inside the upper insulating film 60 to communicate with the second portion Q2.

In some embodiments, the capping insulating film 240 may include an insulating material having an etching selectivity with respect to the upper insulating film 60. As an example, the capping insulating film 240 may include silicon nitride, and the upper insulating film 60 may include silicon oxide. Accordingly, the contact hole 166h in which the region inside the capping insulating film 240 has an expanded form may be formed. For example, the width of the second portion Q2 may be greater than the width of the third portion Q3.

Figure 21:
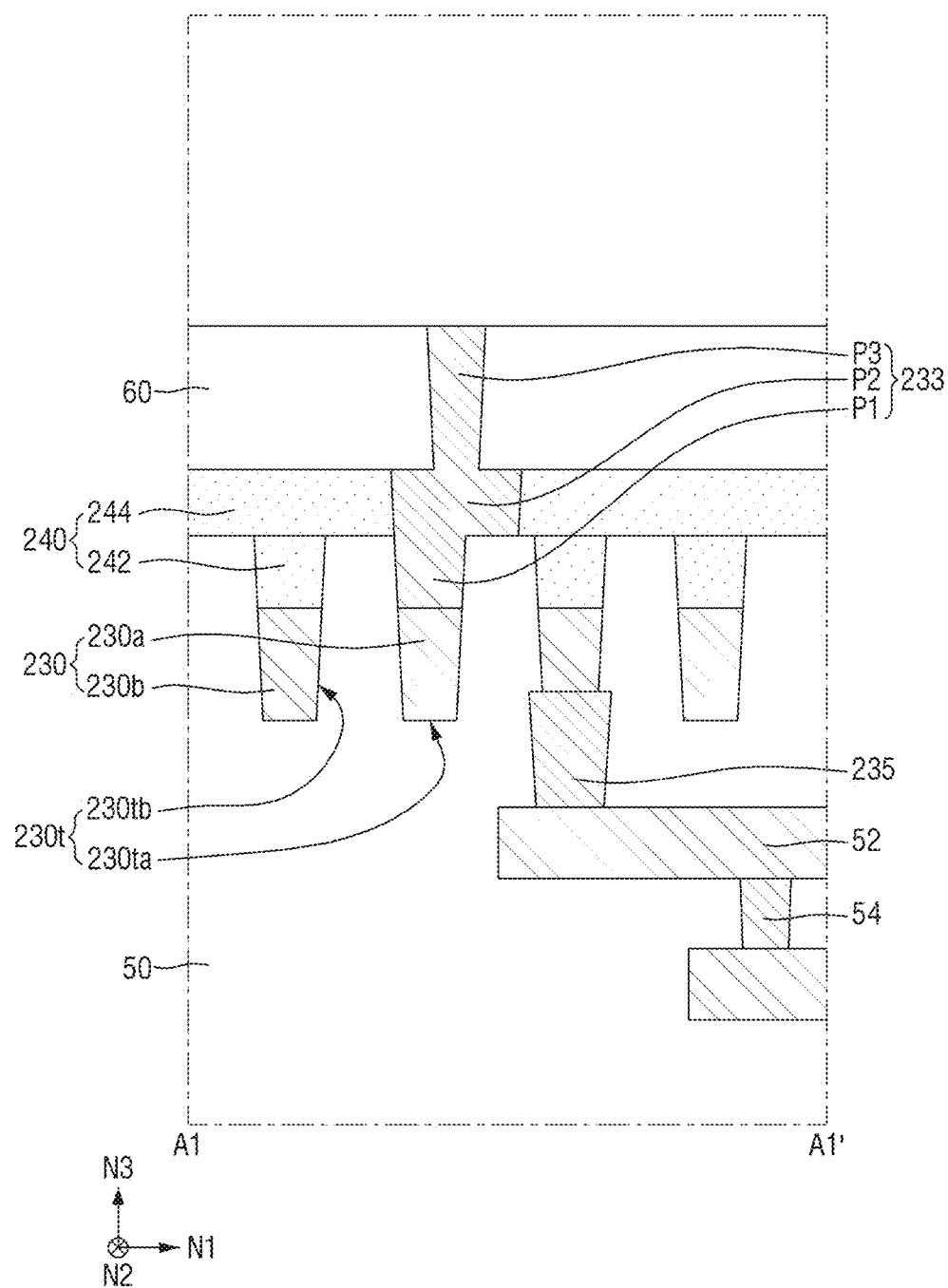

Referring to FIG. 21, an upper contact 233 that is connected to at least a part of the wiring pattern 230 is formed.

For example, a conductive material that fills the contact hole 166h of FIG. 20 may be formed. Accordingly, the upper contact 233 including the contact recess portion P1, the extended portion P2, and the plug portion P3 may be formed.

Next, referring to FIG. 2A, the upper wiring structures 62 and 64 connected to the upper contact 233 are formed. Accordingly, it is possible to provide a method for fabricating a semiconductor device having improved product reliability and yield.

Hereinafter, a method for fabricating a semiconductor memory device including the semiconductor device according to the example embodiments will be described referring to FIGS. 1 to 25.

FIGS. 22 to 25 are intermediate step diagrams for explaining the method for fabricating the semiconductor memory device according to some embodiments. For convenience of explanation, repeated parts of contents explained using FIGS. 1 to 21 will be briefly described or omitted.

Figure 22:
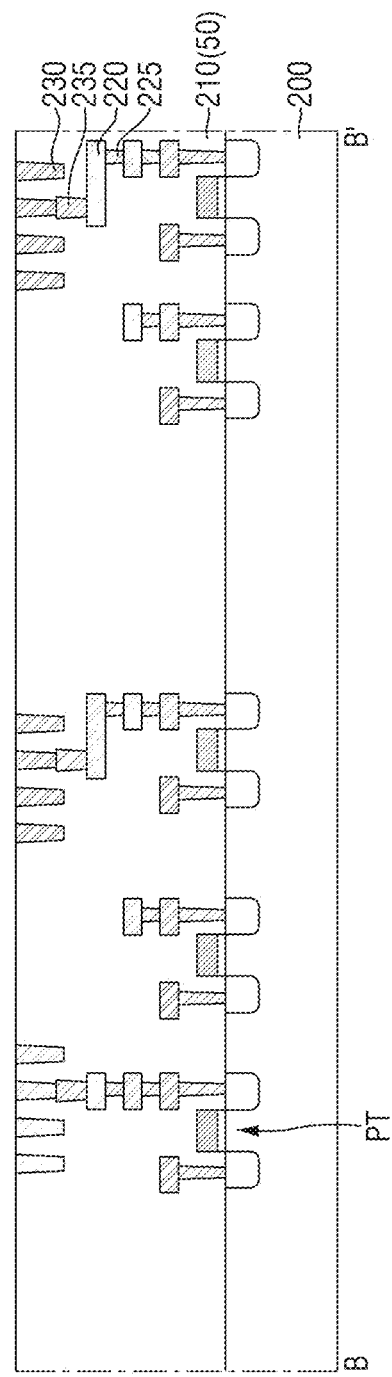
FIGS. 22 to 25 are intermediate step diagrams for explaining the method for fabricating the semiconductor memory device according to some embodiments.

Referring to FIG. 22, the wiring pattern 230 is formed inside the second inter-wiring insulating film 210.

For example, the second inter-wiring insulating film 210, and the second wiring structures 220 and 225 and the lower contact 235 inside the second inter-wiring insulating film 210 may be provided on the second substrate 200. Subsequently, the wiring pattern 230 connected to the lower contact 235 may be formed. Since the formation of the wiring pattern 230 is similar to that described above using FIG. 15, the detailed description will not be provided below.

Figure 23:
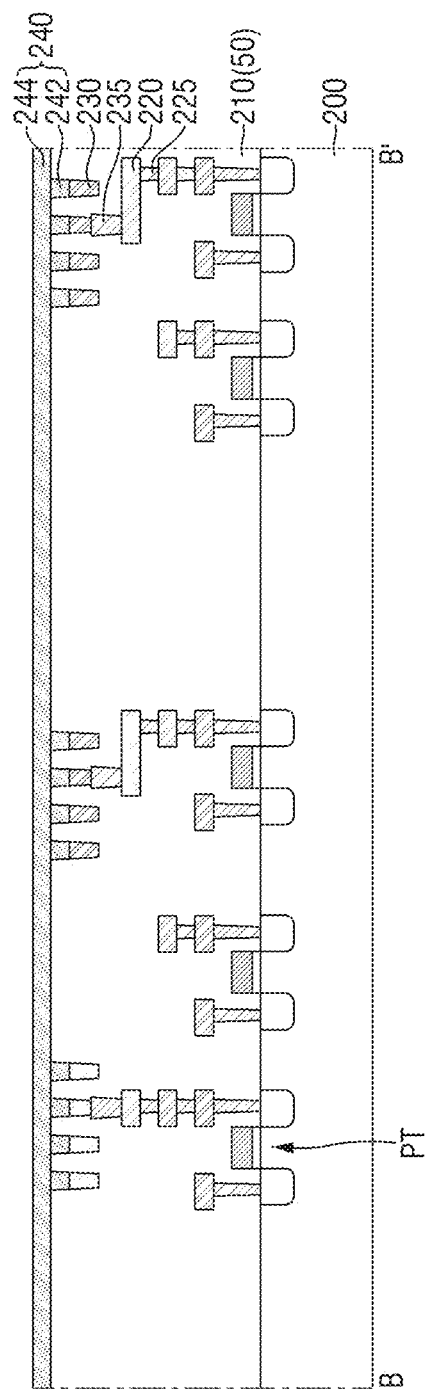

Referring to FIG. 23, the capping insulating film 240 is formed on the second inter-wiring insulating film 210. Since the formation of the capping insulating film 240 is similar to that described above using FIGS. 16 and 17, the detailed description will not be provided below.

Figure 24:
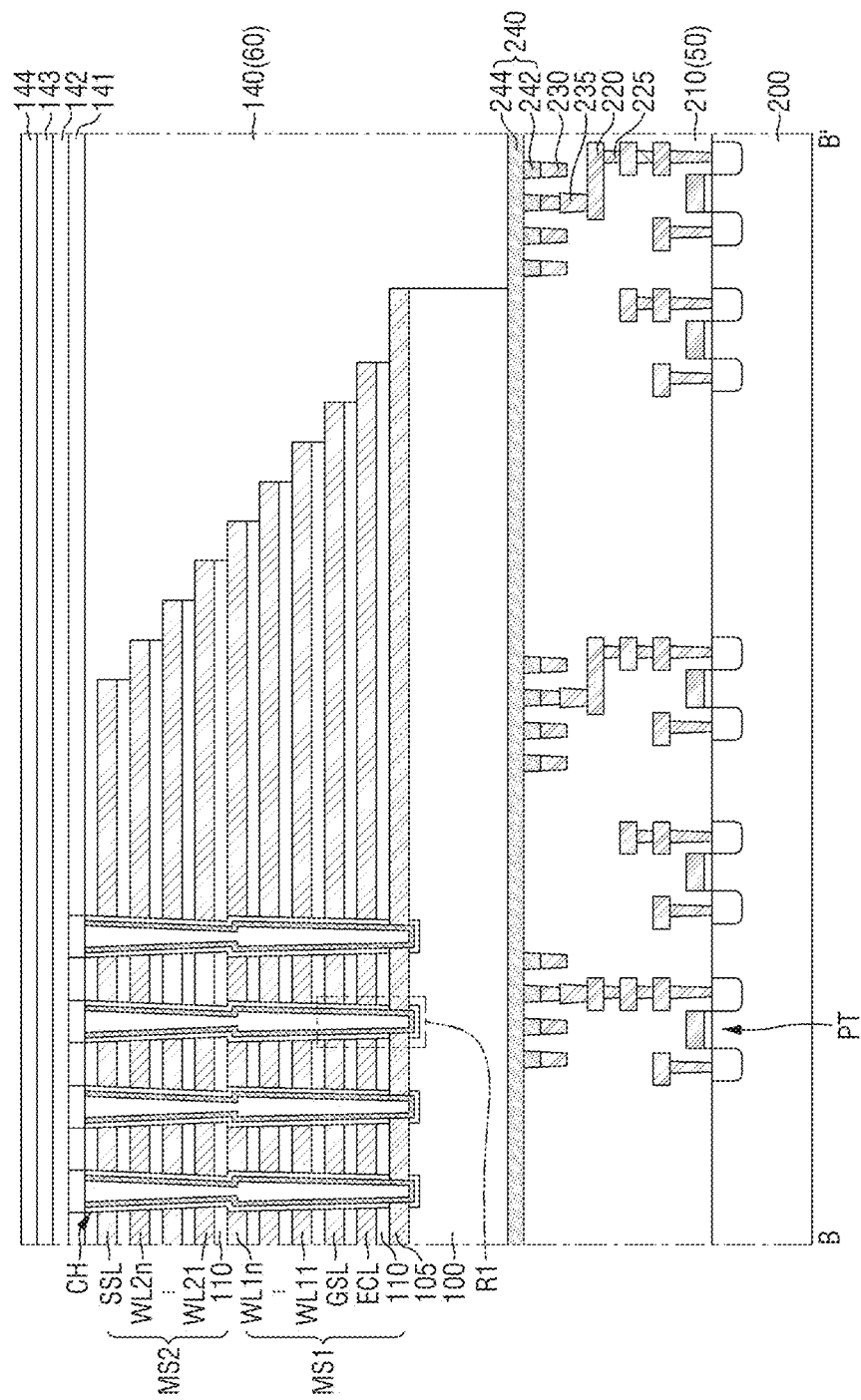

Referring to FIG. 24, the first substrate 100, the mold structures MS1 and MS2, the channel structure CH, the block separation region WLC, and the first to fifth interlayer insulating films 140 to 144 are formed on the capping insulating film 240.

The first to fifth interlayer insulating films 140 to 144 may be formed to cover the first substrate 100, the mold structures MS1 and MS2, the channel structure CH, and the block separation region WLC. In some embodiments, the first substrate 100 and the first to fifth interlayer insulating films 140 to 144 may cover the upper surface of the capping insulating film 240.

Figure 25:
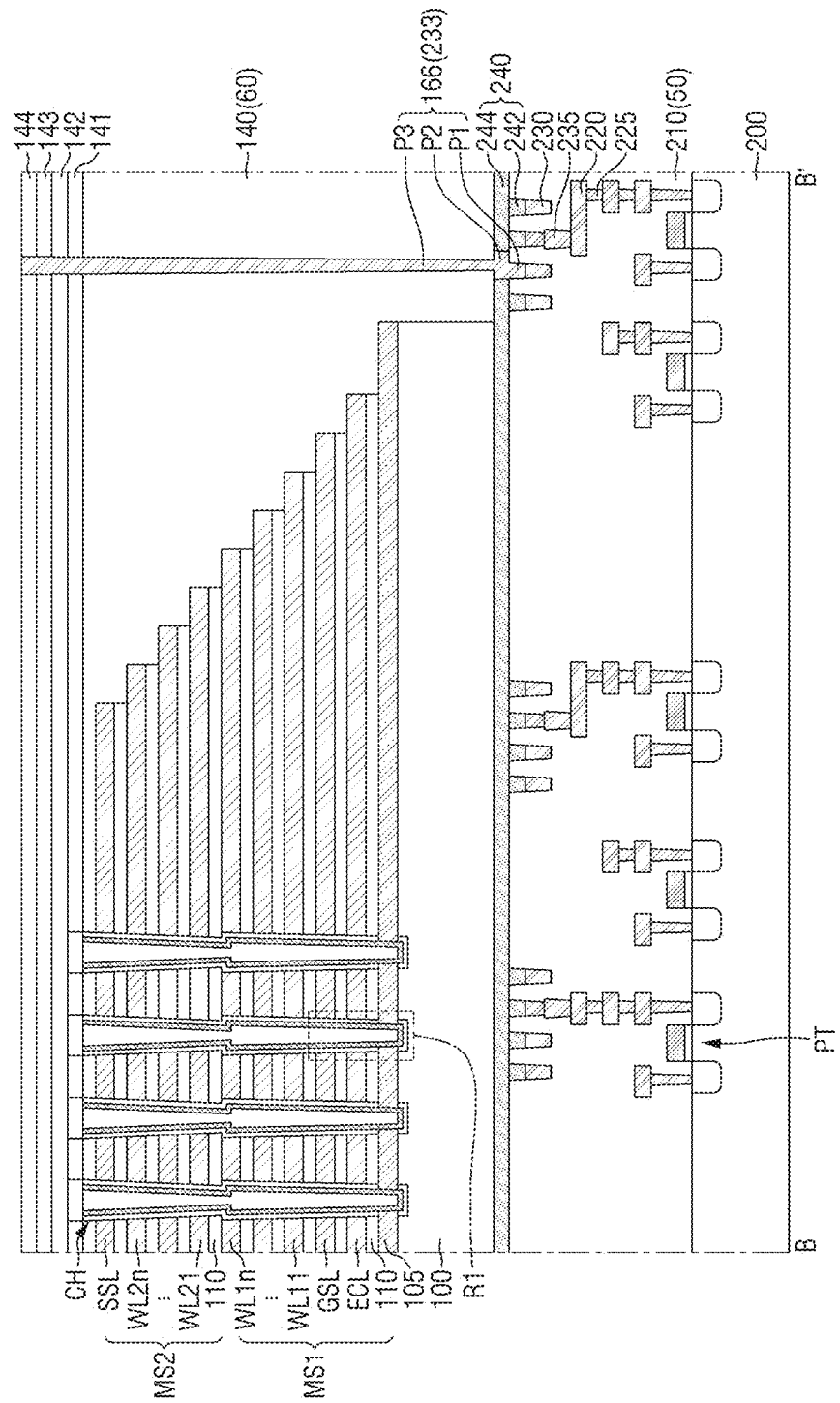

Referring to FIG. 25, a first through contact 166, which penetrates the first to fifth interlayer insulating films 140 to 144 and the capping insulating film 240 and is connected to the wiring pattern 230, is formed. Since formation of the first through contact 166 is similar to formation of the upper contact 233 using FIGS. 18 to 21, the detailed description will not be provided below.

Next, referring to FIG. 8, the bit line contact 160, the gate contact 162, the source contact 164, the bit line BL, the connecting line 170, the first inter-wiring insulating film 145, and the first wiring structures 180 and 185 are formed. Accordingly, it is possible to provide a method for fabricating a semiconductor memory device including a semiconductor device having improved product reliability and yield.

Figure 26:
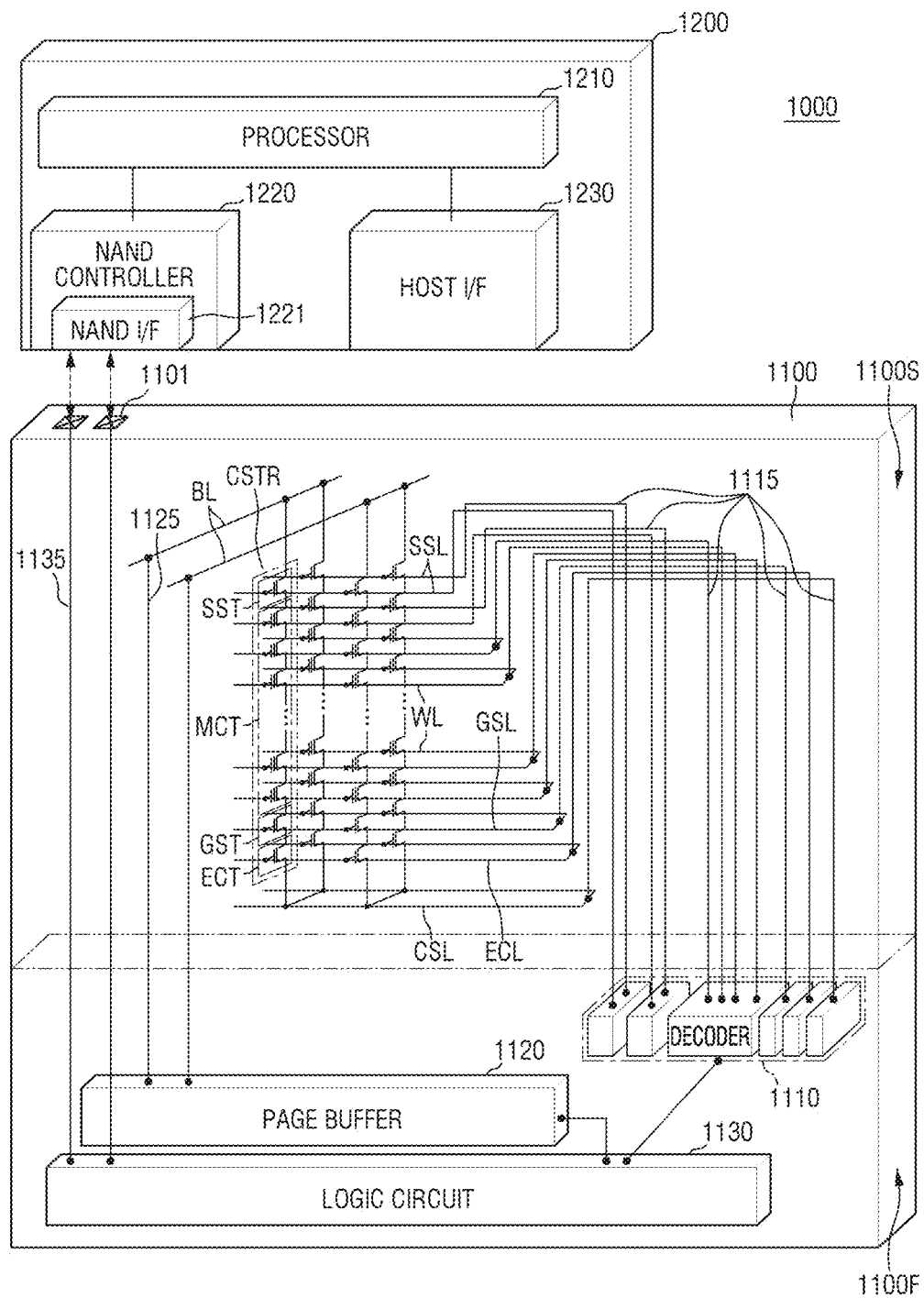
FIG. 26 is a schematic block diagram for explaining an electronic system including the semiconductor memory device according to some embodiments.
Figure 27:
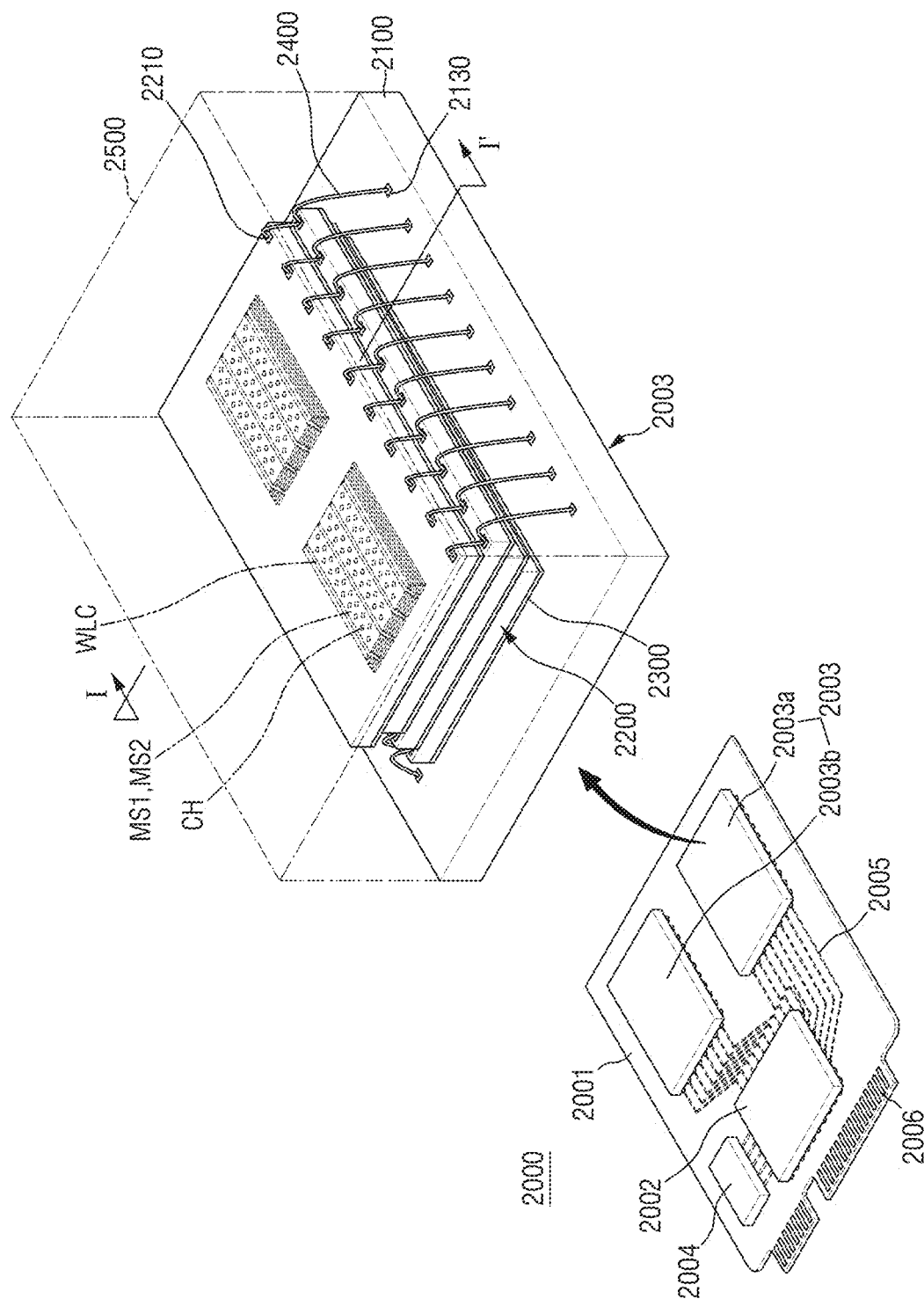
FIG. 27 is a schematic perspective view for explaining the electronic system including the semiconductor memory device according to some embodiments.
Figure 28:
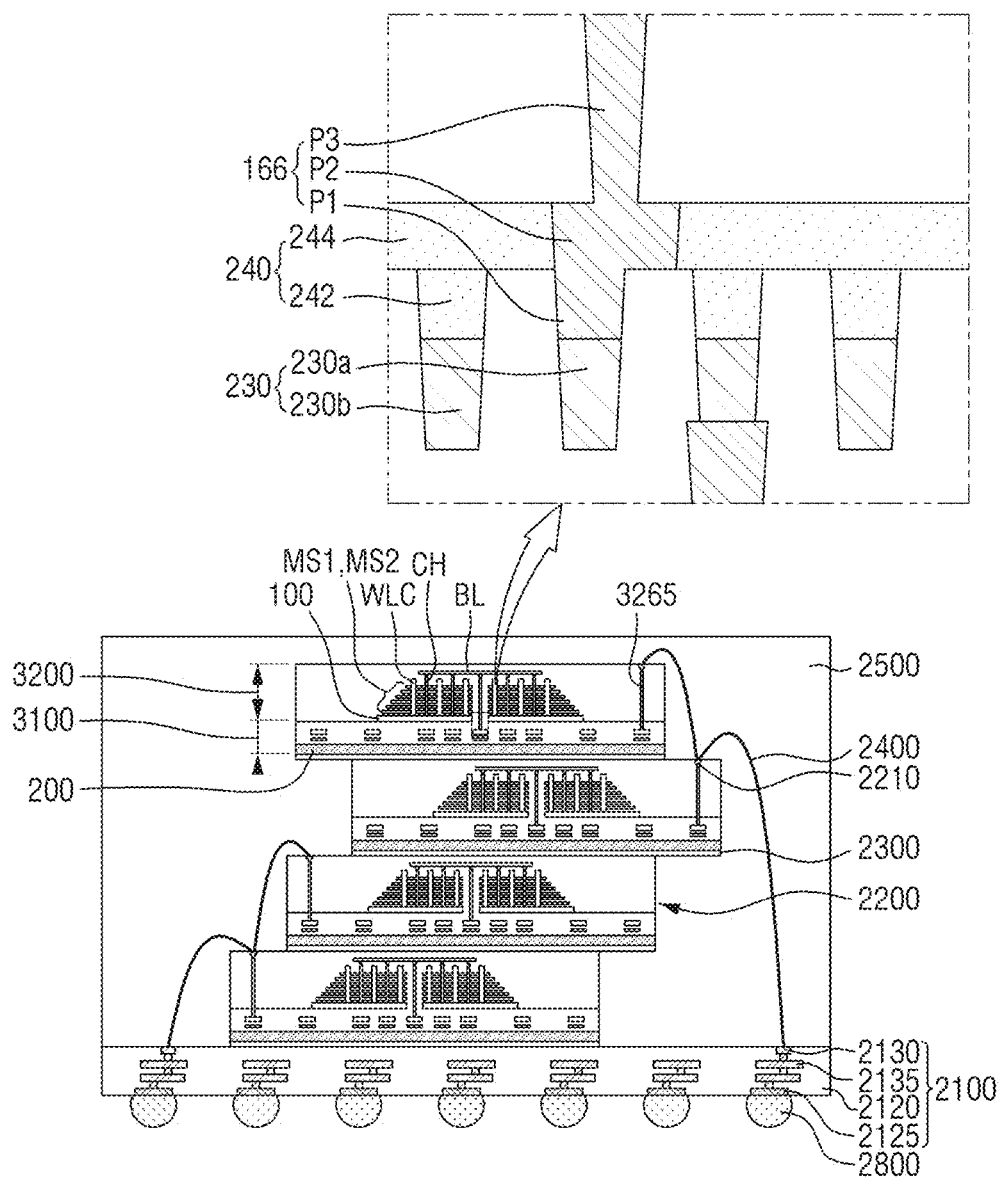
FIG. 28 is a schematic cross-sectional view taken along a line I-I' of FIG. 27.

FIG. 26 is a schematic block diagram for explaining an electronic system including the semiconductor memory device according to some embodiments. FIG. 27 is a schematic perspective view for explaining the electronic system including the semiconductor memory device according to some embodiments. FIG. 28 is a schematic cross-sectional view taken along a line I-I' of FIG. 27.

Referring to FIG. 26, an electronic system 1000 according to some embodiments may include a semiconductor memory device 1100, and a controller 1200 that is electrically connected to the semiconductor memory device 1100. The electronic system 1000 may be a storage device including one or multiple semiconductor memory devices 1100, or an electronic device including the storage device. For example, the electronic system 1000 may be an SSD device (solid state drive device) including one or multiple semiconductor memory devices 1100, a USB (Universal Serial Bus), a computing system, a medical device or a communication device.

The semiconductor memory device 1100 may be a non-volatile memory device (e.g., a NAND flash memory device), and may be, for example, the semiconductor memory device described above using FIGS. 5 to 14. The semiconductor memory device 1100 may include a first structure 1100F, and a second structure 1100S on the first structure 1100F.

The first structure 1100F may be a peripheral circuit structure that includes a decoder circuit 1110 (e.g., the row decoder 33 of FIG. 5), a page buffer 1120 (e.g., the page buffer 35 of FIG. 5), and a logic circuit 1130 (e.g., the control logic 37 of FIG. 5).

The second structure 1100S may include the common source line CSL, the plurality of bit lines BL, and the plurality of cell strings CSTR explained above using FIG. 6. The cell strings CSTR may be connected to the decoder circuit 1110 through the word line WL, at least one string selection line SSL, and at least one ground selection line GSL. Further, the cell strings CSTR may be connected to the page buffer 1120 through the bit lines BL.

In some embodiments, the common source line CSL and the cell strings CSTR may be electrically connected to the decoder circuit 1110 through first connection wirings 1115 that extend from the first structure 1100F to the second structure 1100S. The first connection wiring 1115 may correspond to the first through contact 166 explained above using FIGS. 5 to 14. That is, the first through contact 166 may electrically connect the respective gate electrodes ECL, GSL, WL and SSL and the decoder circuit 1110 (e.g., the row decoder 33 of FIG. 5).

In some embodiments, the bit lines BL may be electrically connected to the page buffer 1120 through second connection wirings 1125 that extend from the first structure 1100F to the second structure 1100S. The second connection wiring 1125 may correspond to the first through contact 166 explained above using FIGS. 5 to 14. That is, the first through contact 166 may electrically connect the bit lines BL and the page buffer 1120 (e.g., the page buffer 35 of FIG. 5).

The semiconductor memory device 1100 may communicate with the controller 1200 through an I/O pad 1101 that is electrically connected to a logic circuit 1130 (e.g., the control logic 37 of FIG. 5). The I/O pad 1101 may be electrically connected to the logic circuit 1130 through an I/O connection wiring 1135 that extends from the inside of the first structure 1100F to the second structure 1100S.

The controller 1200 may include a processor 1210, a NAND controller 1220, and a host interface 1230. In some embodiments, the electronic system 1000 may include a plurality of semiconductor memory devices 1100, and in this case, the controller 1200 may control the plurality of semiconductor memory devices 1100.

The processor 1210 may control the overall operation of the electronic system 1000 including the controller 1200. The processor 1210 may operate according to a predetermined firmware, and may control the NAND controller 1220 to access the semiconductor memory device 1100. The NAND controller 1220 may include a NAND interface 1221 that processes communication with the semiconductor memory device 1100. Control command for controlling the semiconductor memory device 1100, data to be recorded in the memory cell transistors MCT of the semiconductor memory device 1100, data to be read from the memory cell transistors MCT of the semiconductor memory device 1100, and the like may be transmitted through the NAND interface 1221. The host interface 1230 may provide a communication function between the electronic system 1000 and an external host. When receiving the control command from an external host through the host interface 1230, the processor 1210 may control the semiconductor memory device 1100 in response to the control command.

Referring to FIGS. 27 and 28, the electronic system according to some embodiments may include a main board 2001, a main controller 2002 mounted on the main board 2001, one or more semiconductor packages 2003, and a DRAM 2004. The semiconductor package 2003 and the DRAM 2004 may be connected to the main controller 2002 by wiring patterns 2005 formed on the main board 2001.

The main board 2001 may include a connector 2006 including a plurality of pins coupled to an external host. In the connector 2006, the number and arrangement of the plurality of pins may vary depending on the communication interface between the electronic system 2000 and the external host. In some embodiments, the electronic system 2000 may communicate with an external host according to any one of interfaces such as M-Phy for USB (Universal Serial Bus), PCI-Express (Peripheral Component Interconnect Express), SATA (Serial Advanced Technology Attachment), and UFS (Universal Flash Storage). In some embodiments, the electronic system 2000 may operate by power supplied from an external host through the connector 2006. The electronic system 2000 may further include a PMIC (Power Management Integrated Circuit) that distributes the power supplied from the external host to the main controller 2002 and the semiconductor package 2003.

The main controller 2002 may record data on the semiconductor package 2003 or read data from the semiconductor package 2003, and may improve the operating speed of the electronic system 2000.

The DRAM 2004 may be a buffer memory for alleviating a speed difference between the semiconductor package 2003 which is a data storage space, and an external host. The DRAM 2004 included in the electronic system 2000 may also operate as a kind of cache memory, and may also provide a space for temporarily storing data in the control operation of the semiconductor package 2003. When the DRAM 2004 is included in the electronic system 2000, the main controller 2002 may further include a DRAM controller for controlling the DRAM 2004, in addition to the NAND controller for controlling the semiconductor package 2003.

The semiconductor package 2003 may include a first semiconductor package 2003*a* and a second semiconductor package 2003*b* that are spaced apart from each other. The first semiconductor package 2003*a* and the second semiconductor package 2003*b* may each be a semiconductor package that includes a plurality of semiconductor chips 2200. The first semiconductor package 2003*a* and the second semiconductor package 2003*b* may each include a package substrate 2100, semiconductor chips 2200 on the package substrate 2100, adhesive layers 2300 placed on the lower surfaces of each of the semiconductor chips 2200, a connecting structure 2400 for electrically connecting the semiconductor chips 2200 and the package substrate 2100, and a molding layer 2500 that covers the semiconductor chips 2200 and the connecting structure 2400 on the package substrate 2100.

The package substrate 2100 may be a printed circuit board that includes package upper pads 2130. Each semiconductor chip 2200 may include an I/O pad 2210. The I/O pad 2210 may correspond to the I/O pad 1101 of FIG. 26.

In some embodiments, the connecting structure 2400 may be a bonding wire that electrically connects the I/O pad 2210 and the package upper pads 2130. Therefore, in each of the first semiconductor package 2003*a* and the second semiconductor package 2003*b*, the semiconductor chips 2200 may be electrically connected to each other in a bonding wire manner, and may be electrically connected to the upper pads 2130 of the package substrate 2100. In some embodiments, in each of the first semiconductor package 2003*a* and the second semiconductor package 2003*b*, the semiconductor chips 2200 may also be electrically connected to each other by a connecting structure including a through silicon via (TSV) instead of the bonding wire type connecting structure 2400.

In some embodiments, the main controller 2002 and the semiconductor chips 2200 may also be included in a single package. In some embodiments, the main controller 2002 and the semiconductor chips 2200 are mounted on a separate interposer board different from the main board 2001, and the main controller 2002 and the semiconductor chips 2200 may also be connected to each other by the wiring formed on the interposer board.

In some embodiments, the package substrate 2100 may be a printed circuit board. The package substrate 2100 may include a package substrate body portion 2120, package upper pads 2130 placed on an upper surface of the package substrate body portion 2120, lower pads 2125 placed on a lower surface of the package substrate body portion 2120 or exposed through the lower surface, and inner wirings 2135 that electrically connect the upper pads 2130 and the lower pads 2125 inside the package substrate body portion 2120. The upper pads 2130 may be electrically connected to the connecting structures 2400. The lower pads 2125 may be connected to the wiring patterns 2005 of the main board 2010 of the electronic system 2000 through the conductive connections 2800, as in FIG. 27.

Referring to FIG. 28, in the electronic system according to some embodiments, each of the semiconductor chips 2200 may include a peripheral circuit region 3100, and a cell array region 3200 stacked on the peripheral circuit region 3100. Each of the semiconductor chips 2200 may include the semiconductor memory device described above using FIGS. 5 to 14. As an example, the peripheral circuit region 3100 may include the second substrate 200, the peripheral circuit element PT, the wiring pattern 230, the capping insulating film 240, and the first through contact 166 explained above using FIGS. 5 to 10. Further, for example, the cell array region 3200 may include the first substrate 100, the mold structures MS1 and MS2, the channel structure CH, the block separation region WLC, and the bit line BL described above using FIGS. 5 to 10.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While inventive concepts have been particularly shown and described with reference to example embodiments thereof, it will be understood by those of ordinary skill in the art that various changes in form and details may be made therein without departing from the spirit and scope of inventive concepts as defined by the following claims. It is therefore desired that the presented embodiments be considered in all respects as illustrative and not restrictive, reference being made to the appended claims rather than the foregoing description to indicate the scope of inventive concepts.

What is claimed is:

1. A semiconductor device comprising:
   a lower insulating film including a first trench and a second trench adjacent to each other on a substrate;
   a first wiring that fills a part of the first trench;
   a second wiring that fills a part of the second trench;
   a capping insulating film including an insulating recess portion and an insulating liner portion,
      the insulating recess portion filling an other part of the second trench on the second wiring, and
      the insulating liner portion extending along an upper surface of the lower insulating film;
   an upper insulating film that covers an upper surface of the capping insulating film; and
   an upper contact that penetrates the capping insulating film and is connected to the first wiring, wherein
   the upper contact includes a contact recess portion filling an other part of the first trench, an extended portion connected to the contact recess portion inside the insulating liner portion, and a plug portion connected to the extended portion inside the upper insulating film, and
   a width of the extended portion is greater than a width of the plug portion.

2. The semiconductor device of claim 1, wherein the width of the extended portion is greater than a width of the contact recess portion.

3. The semiconductor device of claim 1, wherein a lower surface of the insulating recess portion and a lower surface of the contact recess portion are coplanar.

4. The semiconductor device of claim 1, wherein an upper surface of the insulating liner portion and an upper surface of the extended portion are coplanar.

5. The semiconductor device of claim 1, further comprising:
a lower contact in the lower insulating film and contacting a lower surface of the second wiring.

6. The semiconductor device of claim 5, wherein a width of the lower contact is greater than a width of the second wiring.

7. The semiconductor device of claim 5, wherein an upper surface of the lower contact is higher than a lower surface of the first wiring.

8. The semiconductor device of claim 1, wherein the width of the plug portion decreases toward the capping insulating film.

9. The semiconductor device of claim 1, further comprising:
a peripheral circuit element on the substrate, wherein
the peripheral circuit element is connected to at least one of the first wiring and the second wiring, and
the lower insulating film covers the peripheral circuit element.

10. The semiconductor device of claim 1, further comprising:
a mold structure including a plurality of gate electrodes spaced apart from each other and sequentially stacked on the capping insulating film; and
a channel structure that extends in a vertical direction that intersects an upper surface of the substrate and intersects the plurality of gate electrodes,
wherein the upper insulating film covers the mold structure.

11. The semiconductor device of claim 1, wherein the upper insulating film has an etching selectivity with respect to the capping insulating film.

12. The semiconductor device of claim 11, wherein
the capping insulating film includes silicon nitride, and
the upper insulating film includes silicon oxide.

13. A semiconductor memory device comprising:
a peripheral circuit element on a substrate;
a lower insulating film that covers the peripheral circuit element on the substrate;
a wiring pattern connected to the peripheral circuit element inside the lower insulating film;
a capping insulating film that covers an upper surface of the lower insulating film and an upper surface of the wiring pattern;
a mold structure including a plurality of gate electrodes that are spaced apart from each other and sequentially stacked on the capping insulating film;
a channel structure that extends in a vertical direction that intersects an upper surface of the substrate and intersects the plurality of gate electrodes;
an upper insulating film that covers the mold structure on the capping insulating film; and
an upper contact that penetrates the capping insulating film and is connected to at least a part of the wiring pattern, wherein
the upper contact includes a contact recess portion that contacts at least the part of the wiring pattern inside the lower insulating film, an extended portion connected to the contact recess portion inside the capping insulating film, and a plug portion connected to the extended portion inside the upper insulating film, and
a width of the extended portion is greater than a width of the plug portion.

14. The semiconductor memory device of claim 13, wherein the width of the extended portion is greater than a width of the contact recess portion.

15. The semiconductor memory device of claim 13, wherein
the wiring pattern includes a first wiring and a second wiring adjacent to the first wiring,
the first wiring is connected to the upper contact, and
the second wiring is not connected to the upper contact.

16. The semiconductor memory device of claim 15, wherein
the capping insulating film includes an insulating recess portion and an insulating liner portion,
the insulating recess portion covers an upper surface of the second wiring inside the lower insulating film, and
the insulating liner portion extends along the upper surface of the lower insulating film.

17. The semiconductor memory device of claim 15, further comprising:
a lower contact in the lower insulating film and contacting a lower surface of the second wiring.

18. The semiconductor memory device of claim 13, further comprising:
a block separation region extending in a first direction that intersects the vertical direction, the block separation region cutting the mold structure; and
a bit line on the mold structure, the bit line extending in a second direction intersecting the vertical direction and the first direction, and the bit line being connected to the channel structure.

19. The semiconductor memory device of claim 18, wherein the upper contact connects at least one of the bit line and the plurality of gate electrodes to the wiring pattern.

20. An electronic system comprising:
a main board;
a semiconductor memory device on the main board; and
a controller electrically connected to the semiconductor memory device on the main board,
wherein the semiconductor memory device includes an I/O pad, a peripheral circuit element connected to the I/O pad on a substrate, a lower insulating film that covers the peripheral circuit element on the substrate, a wiring pattern connected to the peripheral circuit element inside the lower insulating film, a capping insulating film that covers an upper surface of the lower insulating film and an upper surface of the wiring pattern, an upper insulating film that covers an upper surface of the capping insulating film, and an upper contact that penetrates the capping insulating film and is connected to at least a part of the wiring pattern,
wherein the upper contact includes a contact recess portion contacting with at least a part of the wiring pattern inside the lower insulating film, an extended portion connected to the contact recess portion inside the capping insulating film, and a plug portion connected to the extended portion inside the upper insulating film, and
wherein a width of the extended portion is greater than a width of the plug portion.

* * * * *